US008996938B2

(12) United States Patent
Dervisoglu et al.

(10) Patent No.: US 8,996,938 B2
(45) Date of Patent: *Mar. 31, 2015

(54) ON-CHIP SERVICE PROCESSOR

(75) Inventors: Bulent Dervisoglu, Mountain View, CA (US); Laurence H. Cooke, Los Gatos, CA (US); Vacit Arat, Los Altos Hills, CA (US)

(73) Assignee: Intellectual Ventures I LLC, Wilmington, DE (US)

( * ) Notice: Subject to any disclaimer, the term of this patent is extended or adjusted under 35 U.S.C. 154(b) by 90 days.

This patent is subject to a terminal disclaimer.

(21) Appl. No.: 13/027,009

(22) Filed: Feb. 14, 2011

(65) Prior Publication Data

US 2012/0011411 A1 Jan. 12, 2012

Related U.S. Application Data

(63) Continuation of application No. 12/717,391, filed on Mar. 4, 2010, now Pat. No. 8,239,716, which is a continuation of application No. 11/424,610, filed on Jun. 16, 2006, now Pat. No. 7,836,371, which is a (Continued)

(51) Int. Cl.
*G01R 31/28* (2006.01)
*G01R 31/3185* (2006.01)

(Continued)

(52) U.S. Cl.
CPC .. *G01R 31/318572* (2013.01); *G01R 31/31705* (2013.01); *G01R 31/31723* (2013.01); *G01R 31/318385* (2013.01); *G01R 31/318566* (2013.01)
USPC .......................... 714/726; 714/727; 714/729

(58) Field of Classification Search
CPC ............ G06F 11/3495; G06F 11/3466; G06F 2201/88; G06F 11/3409; G06F 11/364; G01R 31/31705; G01R 31/31723; G01R 31/318385
USPC ........ 714/733, 726, 727, 729, 39, 30; 703/28; 324/754.07, 750.3
See application file for complete search history.

(56) References Cited

U.S. PATENT DOCUMENTS

| 3,761,695 A | 9/1973 | Eichelberger |
| 3,783,254 A | 1/1974 | Eichelberger |
| 3,784,907 A | 1/1974 | Eichelberger |

(Continued)

OTHER PUBLICATIONS

"BIST TPG for Faults in System Backplanes"; Proceedings of the 1997 IEEE/ACM International Conference on Computer-Aided Design, 1997, pp. 406-413.

(Continued)

*Primary Examiner* — David Ton
(74) *Attorney, Agent, or Firm* — Sterne, Kessler, Goldstein & Fox PLLC

(57) ABSTRACT

An integrated circuit is described that includes a stored program processor for test and debug of user-definable logic plus external interface between the test/debug circuits and the component pins. The external interface may be via an existing test interface or a separate serial or parallel port. Test and debug circuits may contain scan strings that may be used to observe states in user-definable logic or be used to provide pseudo-random bit sequences to user-definable logic. Test and debug circuits may also contain an on-chip logic analyzer for capturing sequences of logic states in user-definable circuits. Test and debug circuits may be designed to observe states in user-definable circuits during the normal system operation of said user-definable circuits.

22 Claims, 20 Drawing Sheets

Related U.S. Application Data continuation of application No. 11/261,762, filed on Oct. 31, 2005, now Pat. No. 7,080,301, which is a continuation of application No. 10/767,265, filed on Jan. 30, 2004, now Pat. No. 6,964,001, which is a continuation of application No. 09/275,726, filed on Mar. 24, 1999, now Pat. No. 6,687,865.

(60) Provisional application No. 60/079,316, filed on Mar. 25, 1998.

(51) Int. Cl.
*G01R 31/317* (2006.01)
*G01R 31/3183* (2006.01)

(56) References Cited

U.S. PATENT DOCUMENTS

| | | | |
|---|---|---|---|
| 4,342,958 A * | 8/1982 | Russell | 324/754.07 |
| 4,357,703 A | 11/1982 | Van Brunt | |
| 4,495,629 A | 1/1985 | Zasio et al. | |
| 4,590,550 A | 5/1986 | Eilert et al. | |
| 4,667,339 A | 5/1987 | Tubbs et al. | |
| 4,749,947 A | 6/1988 | Gheewala | |
| 4,817,093 A | 3/1989 | Jacobs et al. | |
| 4,821,178 A | 4/1989 | Levin et al. | |
| 4,866,507 A | 9/1989 | Jacobs et al. | |
| 4,932,028 A | 6/1990 | Katircioglu et al. | |
| 4,959,772 A | 9/1990 | Smith et al. | |
| 5,065,090 A | 11/1991 | Gheewala | |
| 5,068,881 A | 11/1991 | Dervisoglu et al. | |
| 5,129,078 A | 7/1992 | Groves et al. | |
| 5,155,432 A | 10/1992 | Mahoney | |
| 5,202,624 A | 4/1993 | Gheewala et al. | |
| 5,202,625 A | 4/1993 | Farwell | |
| 5,206,862 A | 4/1993 | Chandra et al. | |
| 5,206,948 A | 4/1993 | De Angelis et al. | |
| 5,254,482 A | 10/1993 | Fisch | |
| 5,255,374 A | 10/1993 | Aldereguia et al. | |
| RE34,445 E | 11/1993 | Hayes et al. | |
| 5,329,471 A | 7/1994 | Swoboda et al. | |
| 5,369,648 A | 11/1994 | Nelson | |
| 5,402,431 A | 3/1995 | Saadeh et al. | |
| 5,404,526 A | 4/1995 | Dosch et al. | |
| 5,418,470 A | 5/1995 | Dagostino et al. | |
| 5,423,050 A | 6/1995 | Taylor et al. | |
| 5,428,629 A | 6/1995 | Gutman et al. | |
| 5,479,652 A | 12/1995 | Dreyer et al. | |
| 5,495,486 A | 2/1996 | Gheewala | |
| 5,526,286 A | 6/1996 | Sauerwein et al. | |
| 5,541,505 A * | 7/1996 | Azumai | 324/750.3 |
| 5,590,354 A | 12/1996 | Klapproth et al. | |
| 5,617,531 A | 4/1997 | Crouch et al. | |
| 5,623,500 A | 4/1997 | Whetsel, Jr. | |
| 5,630,048 A | 5/1997 | La Joie et al. | |
| 5,642,478 A | 6/1997 | Chen et al. | |
| 5,656,949 A | 8/1997 | Yip et al. | |
| 5,684,980 A | 11/1997 | Casselman | |
| 5,687,174 A | 11/1997 | Edem et al. | |
| 5,724,505 A | 3/1998 | Argade et al. | |
| 5,737,520 A | 4/1998 | Gronlund et al. | |
| 5,751,945 A | 5/1998 | Levine et al. | |
| 5,761,489 A | 6/1998 | Broseghini et al. | |
| 5,771,240 A | 6/1998 | Tobin et al. | |
| 5,802,273 A | 9/1998 | Levine et al. | |
| 5,805,792 A | 9/1998 | Swoboda et al. | |
| 5,838,163 A | 11/1998 | Rostoker et al. | |
| 5,850,512 A | 12/1998 | Song | |
| 5,854,996 A | 12/1998 | Overhage et al. | |
| 5,867,644 A | 2/1999 | Ranson et al. | |
| 5,905,738 A | 5/1999 | Whetsel | |
| 5,936,876 A | 8/1999 | Sugasawara | |
| 5,941,995 A | 8/1999 | Morrison | |
| 5,943,490 A | 8/1999 | Sample | |
| 5,944,841 A | 8/1999 | Christie | |
| 5,953,372 A | 9/1999 | Virzi | |
| 5,978,937 A | 11/1999 | Miyamori et al. | |
| 5,991,898 A | 11/1999 | Rajski et al. | |
| 6,003,107 A | 12/1999 | Ranson et al. | |
| 6,003,142 A | 12/1999 | Mori | |
| 6,028,983 A * | 2/2000 | Jaber | 714/30 |
| 6,035,262 A | 3/2000 | Gibson et al. | |
| 6,035,431 A | 3/2000 | Higashida | |
| 6,094,729 A | 7/2000 | Mann | |
| 6,107,821 A | 8/2000 | Kelem et al. | |
| 6,125,464 A | 9/2000 | Jin | |
| 6,131,171 A | 10/2000 | Whetsel | |
| 6,167,536 A | 12/2000 | Mann | |
| 6,182,247 B1 * | 1/2001 | Herrmann et al. | 714/39 |
| 6,189,140 B1 | 2/2001 | Madduri | |
| 6,247,147 B1 | 6/2001 | Beenstra et al. | |
| 6,285,211 B1 | 9/2001 | Sample et al. | |
| 6,286,114 B1 | 9/2001 | Veenstra et al. | |
| 6,321,320 B1 | 11/2001 | Fleischman et al. | |
| 6,374,370 B1 | 4/2002 | Bockhaus et al. | |
| 6,460,148 B2 | 10/2002 | Veenstra et al. | |
| 6,465,893 B1 | 10/2002 | Khandros et al. | |
| 6,499,123 B1 | 12/2002 | McFarland et al. | |
| 6,522,985 B1 | 2/2003 | Swoboda et al. | |
| 6,564,347 B1 | 5/2003 | Mates | |
| 6,687,865 B1 | 2/2004 | Dervisoglu et al. | |
| 6,704,889 B2 | 3/2004 | Veenstra et al. | |
| 6,708,296 B1 | 3/2004 | Gover et al. | |
| 6,711,042 B2 | 3/2004 | Ishikawa | |
| 6,727,579 B1 | 4/2004 | Eldridge et al. | |
| 6,782,498 B2 | 8/2004 | Tanizaki et al. | |
| 6,964,001 B2 | 11/2005 | Dervisoglu et al. | |
| 7,152,027 B2 | 12/2006 | Andrade et al. | |
| 7,836,371 B2 | 11/2010 | Dervisoglu et al. | |
| 2006/0064615 A1 | 3/2006 | Dervisoglu et al. | |

OTHER PUBLICATIONS

"Design of Self-Diagnostic Boards by Multiple Signature Analysis"; IEEE Transactions on Computers, vol. 42, No. 9, Sep. 1993, pp. 1035-1044.

"Using Scan Technology for Debug and Diagnostics in a Workstation Environment"; Proceedings of the International Test Conference, 1988, Sep. 1988, pp. 976-986.

*Xilinx, Inc. v. Intellectual Ventures*, Nos. 5:11-cv-671 EJD, 5:11-cv-4407 EJD, Xilinx, Inc.'s Invalidity Contentions under Patent Local Rule 3-3, filed Jun. 29, 2012.

*Xilinx, Inc. v. Intellectual Ventures*, Nos. 5:11-cv-671 EJD, 5:11-cv-4407 EJD, Xilinx, Inc.'s Invalidity Contentions under Patent Local Rule 3-3, Exh. C, filed Jun. 29, 2012.

*Xilinx, Inc. v. Intellectual Ventures*, Nos. 5:11-cv-671 EJD, 5:11-cv-4407 EJD, Xilinx, Inc.'s Invalidity Contentions under Patent Local Rule 3-3, Exh. D, filed Jun. 29, 2012.

"Complaint in *Xilinx, Inc. v. Invention Investment Fund I LP*, Invention Investment Fund II LLC, Intellectual Ventures LLC, Intellectual Ventures Management LLC, Intellectual Ventures I LLC, and Intellectual Ventures II LLC", No. 5:11-cv-671 (N. D. Cal. Feb. 14, 2011).

Declaration of M. Ray Mercer, PhD, filed Sep. 20, 2012 by Third Party Requester in Proceeding U.S. Appl. No. 95/001,579, 6 pages.

"Starting Point for a Scalable Core Test Access Architecture Based on a Standardized Core Test Access Port (CTAP)", http://grouper.ieee.org/groups/1500/vts97/ctap.htm1,1997.

"How is the ARM7TDMI Core Tested?", ARM Technical Support Knowledge Articles, Retrieved from the Internet on Oct. 28, 2011 at: http://infocenter.arm.com/help/index.jsp?topic=/com.arm.doc.faqs/3673.html, Sep. 2008.

"IEEE Standard Test Access Port and Boundary-Scan Architecture", IEEE Std 1149.1, Section 7.6, 1993.

"Inter Partes Reexamination of U.S. Patent No. 7,080,301, Control No. 95/001,579", Declaration Under 37 C.F.R. § 1.132 of M. Ray Mercer, Ph.D., Aug. 4, 2011.

"System in a Package (SIP): The 3-D Package", retrieved from the Internet on Oct. 24, 2011 at: http://www.siliconfareast.com/sip.htm.

"System in Package", retrieved from the Internet on Oct. 24, 2011 at: http://www.absoluteastronomy.com/topics/System_in_package.

(56) References Cited

OTHER PUBLICATIONS

"System-on-a-chip", retrieved from the Internet on Oct. 24, 2011 at: http://www.absoluteastronomy.com/topics/System_in_package.

Abadir, Magdy, "Economics Modeling of Multichip Modules Testing Strategies", IEEE Transactions on Components, Packaging, and Manufacturing Technology, Part B, vol. 21, No. 4, Nov. 1998, 360-370.

Aerts, et al., "Scan Chain Design for Test Time Reduction in Core-Based ICs", IEEE International Test Conference, 1998, 448-457.

Altera Corporation, "Design Debugging Using the SignalTap II Logic Anaylzer", Quartus II Handbook Version 11.1, vol. 3: Verification, 2011.

Bhatia S., "A Unifying Methodology for Intellectual Property and Custom Logic Testing", Proc. of International Test Conference, Oct. 1996.

Blum, Norman A. et al., "Multichip Module Substrates", Johns Hopkins APL Technical Digest, vol. 20, No. 1, 1999, 62-69.

Bushnell, M.L., "Essentials of Electronic Testing for Digital, Memory, and Mixed-Signal VLSI Circuits", Springer Publishing, 2000.

Collins, Luke, "Silicon Sandwich", IET Electronics Systems and Software, Apr./May 2006, 34-37.

Crouch, A., "Design-For-Test for Digital ICs and Embedded Core Systems", Prentice Hall, 1999.

Flint, Andrew, "MCM Test Strategy Synthesis from Chip Test and Board Test Approaches", Journal of Electronic Testing: Theory and Applications 10, appears in the textbook: "Multi-chip module test strategies," Yervant Zorian, 1997, 65-76.

Franklin, et al., "A Built-In Self-Test Algorithm for Row/Column Pattern Sensitive Faults in Ram's", IEEE Journal of Solid-State Circuits, vol. 25, No. 2, 1990, 514-524.

Franklin, Manoj et al., "Built-In Self Testing of Random-Access Memories, Computer, Oct. 1990", 45-56.

Konoshita, et al., "Built-In Testing of Memory Using an On-Chip Compact Testing Scheme", IEEE Transaction on Computers, vol. C-35, No. 10, 1986, 862-870.

Kuan, A., "A 'How to' tutorial on logic analyzer basics for digital design", http://eetimes.com/General/PrintView//4015108, 2007.

Malhi, Vijay, "PoP, SiP, MCM, MCP or SoC: Assessing the tradeoffs", EE Times-India, Dec. 2006, 1-2.

Mathewson, "Core Provider's Test Experience", Presentation at IEEE P1500 Working Group Meeting, Sunnyvale, CA, 1998.

Matsuda, et al., "A New Array Architecture for Parallel Testing in VLSI Memories", Paper 16.2, 1989 International Test Conferences, IEEE, 1989, 322-326.

Mazumder, et al., "Parallel Testing for Faults in Ram's", IEEE Transaction on Computer, vol. 38, No. 3, 1989, 396-407.

Miyaji, et al., "A Multibit Test Trigger Circuit for Megabit SRAM's", IEEE Journal of Solid-State Circuits, vol. 25, No. 1, 1990, 68-71.

Noun, Ziad, "Wireless Approach for SIP and SOC Testing", Doctoral Thesis, Université Montpellier II, Sciences et Technique du Languedoc, Aug. 31, 2010.

Ohsawa, et al., "A 60-ns 4-Mbit CMOS DRAM with Built-In Self Test Function", IEEE Journal of Solid-State Circuits, vol. SC-22, No. 5, 1987, 663-668.

Rajski, et al., "Modular Logic Built-In Self Test for IP Cores", IEEE International Test Conference, 1998, 313-321.

Saluja, et al., "Built-In Self-Testing RAM: A Practical Alternative", IEEE Design and Test, 1987, 42-51.

Saperstein, Bill, "So-C vc SiP: Design Alternatives and Challenges", EE Times-India, 2008, 1-2.

Silburt, et al., "Serial Interfacing for Embedded-Memory Testing", IEEE Design and Test of Computers, 1990, 52-63.

Siliconfareast, "Built-in Self Test (BIST)", http://www.siliconfareast.com/bist.htm, 2003-2005.

Takeshima, et al., "A 55-ns 16-Mb DRAM With Built-In Self Test Function Using Microprogram ROM", IEEE Journal of Solid-State Circuits, vol. 25, No. 4, 1990, 903-911.

Tektronix, "The XYZs of Logic Analyzers", 2001.

Trigas, Cynthia, "System-In-Package or System-On-Chip?", EE Times, retrieved from the Internet on Oct. 26, 2011 at: http://www.design-reuse.com/articles/6323/system-in-package-or-system-on-chip.html, Sep. 19, 2003.

Tummala, Rao, "Electro IQ The Portal for Electronics Manufacturing", retrieved from the Internet on Oct. 7, 2011 at: http://www.electroiq.com/articles/ap/print/volume-15/issue-7/departments/editorial-board/ . . . .

Tummala, Rao, "SOP: What is it and Why? A New Microsystem-Integration Technology Paradigm-Moore's Law for System Integration of Miniaturized Convergent Systems of the Next Decade", IEEE Transaction on Advanced Packaging, vol. 27, No. 2, May 2004, 241-249.

Van De Goor, et al., "An Overview of Deterministic Functional RAM Chip Testing", ACM Computing Surveys, vol. 22, No. 1, 1990, 5-33.

Voss, et al., "A 14-ns 256Kx1 CMOS SRAM With Multiple Test Modes", IEEE Journal of Solid-State Circuits, vol. 24, No. 4, 1989, 874-880.

Wang, L.T., "VLSI Test Principles and Architectures", Morgan Kaufman Publishers, 2006.

You, et al., "A Self-Testing Dynamic RAM Chip", IEEE Journal of Solid-State Circuits, vol. SC-20, No. 1, 1985, 428-435.

Zorian, et al., "System-Chip Test Strategies", ACM, 1998, 752-757.

Zorian, "Test Requirement for Embedded Core-based Systems and IEEE P1500", International Test Conference 1997 (ICT '97), Nov. 1-6, 1997, 191-199.

Zorian, et al., "Testing Embedded-Core Based System Chips", IEEE International Test Conference, 1998, 130-143.

Zorian, Y., "IEEE P1500: Backgrounder", Logicvision, Inc., 1998.

Zorian, Yervant et al., "An Effective Multi-Chip BIST Scheme", Journal of Electronic Testing: Theory and Applications 10, appears in the textbook: "Multi-chip module test strategies," 1997.

PowerPC 604 RISC Microprocessor User's Manual, IBM Microelectronics, PowerPC, Motorola, 1994.

* cited by examiner

Preferred Embodiment of Test Bus Connector

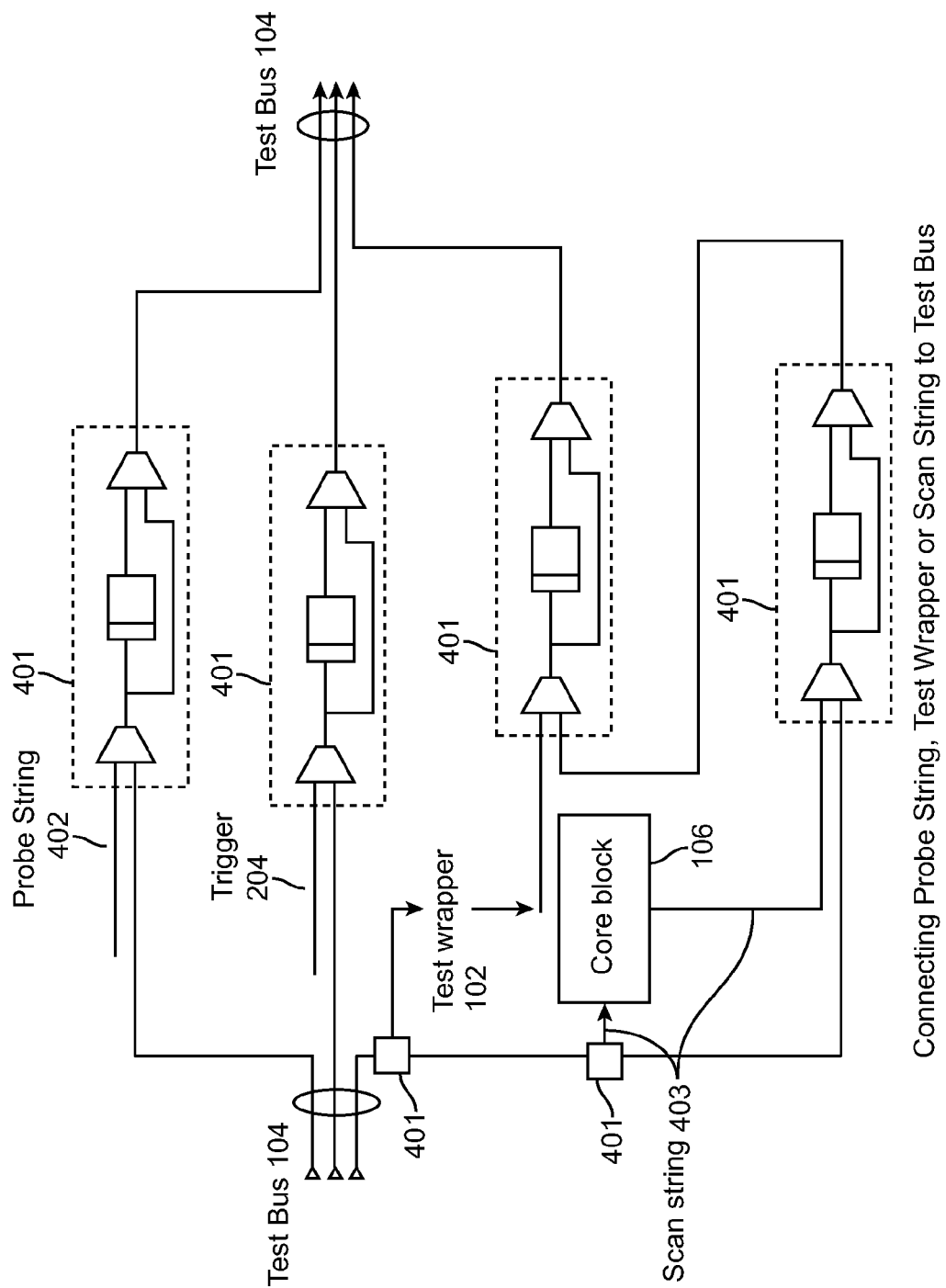

Preferred Embodiment of Block Input/Output Port Connector

Preferred Embodiment of Block Scan Connector

Internal Scan Element with Separate Scan-Slave and Data-Slave:
(prior art)

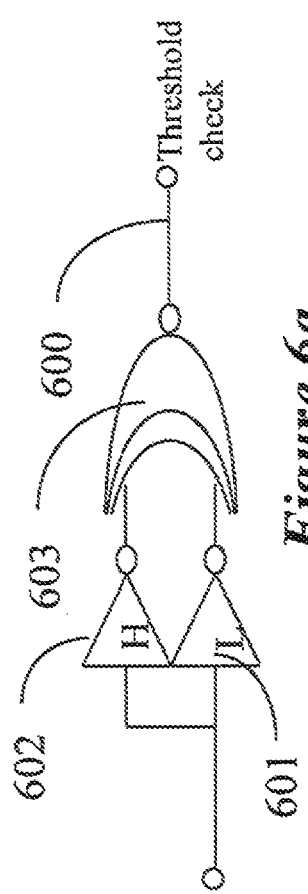
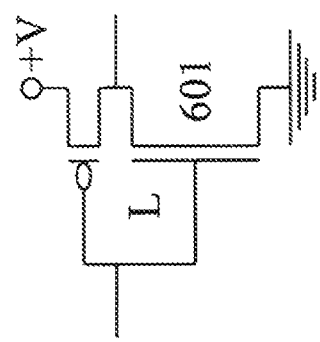
*Figure 6a*
*Figure 6b*

ON-CHIP SERVICE PROCESSOR

CROSS REFERENCE TO RELATED APPLICATIONS

This application is a continuation of co-pending U.S. patent application Ser. No. 12/717,391, which is a continuation of U.S. patent application Ser. No. 11/424,610, filed Jun. 16, 2006 (which issued as U.S. Pat. No. 7,836,371), which is a continuation of U.S. patent application Ser. No. 11/261,762, filed Oct. 31, 2005 (which issued as U.S. Pat. No. 7,080,301), commonly-assigned, and incorporated by reference in its entirety. That application is a continuation of U.S. patent application Ser. No. 10/767,265, entitled, "On-Chip Service Processor," filed on Jan. 30, 2004 (which issued as U.S. Pat. No. 6,964,001), commonly-assigned, and incorporated by reference herein in its entirety. That application is a continuation of U.S. Patent Application No. 09/275,726, entitled, "On-Chip Service Processor," filed on Mar. 24, 1999 (which issued as U.S. Patent No. 6,687,865), commonly-assigned, and also incorporated by reference herein in its entirety. That application, in turn, is entitled to the priority of U.S. Provisional Patent Application No. 60/079,316, filed on Mar. 25, 1998.

BACKGROUND OF THE INVENTION

The present invention is related to the testing and debugging of electronic systems, and, in particular, to on-chip circuits for the test and diagnosis of problems in an integrated circuit.

Heretofore, logic analyzer probes have often been used in the testing and debugging of electronic systems. The logic analyzer probes were coupled to the external pins of components of a digital system in order to capture the sequence of signals after a predefined event (or time stamp) occurs. The captured signals can then be examined to verify correct system behavior or, alternatively, to identify the time and the nature of erroneous behavior in the system.

Furthermore, in the designs of large electronic systems, separate consoles, or service processors, have often been incorporated into the circuit boards of the system. These separate processors have a number of useful functions, including the control of scan strings in the system; the origination of diagnostic signal probes to run on the system, and so forth. The service processors also have diagnostic and scan debug features, including access to the internal registers and memory within the system. The service processors have also been used to bring-up the main system during its power up phase. All of these functions have been useful to system designers for the design, test and debugging of electronic systems.

On the other hand, more and more digital systems, or parts of digital systems, are being integrated in a single component. The resulting complexity and lack of observability of an integrated circuit poses serious problems for the test, debug and bring-up stages of the integrated circuit (IC). For example, observation at the IC component pins of the behavior of an IC system is increasingly difficult. The IC component pins may be very far (in terms of logic hierarchy) from the actual points of interest. The extremely high frequency of digital IC operations and the frequency filtering effects of the large capacitance of the external logic analyzer probes, often prevents a logic analyzer from capturing signals reliably and precisely. There is always an uncertainty regarding the accuracy of signals captured by an external logic analyzer compared to the actual signals values within the IC.

To address the problems of the testing of integrated circuits, special features are being included in many IC designs. For example, one standard technique is "scan" whereby, certain internal flip-flops, which are connected to various selected points of the IC, are also connected to form a serial shift register when the IC is configured in a test mode. Straightforward serial shift (i.e., scan) operations are utilized to load the flip-flops with desired values, or to read out their present values reflective of the logic states of the selective IC points. Such ICs require special features to reset the flip-flops (i.e., bring the IC to a known starting state). However, the size of integrated circuits has grown to the point where it has become inefficient and expensive to test and debug ICs using solely conventional scan techniques.

Furthermore, variations of the serial scan technique include the use of so-called "shadow registers." IC internal signal states are captured in a duplicate copy, i.e., the shadow register, of certain internal registers. The shadow registers are interconnected by a dedicated internal scan chain. A predetermined event can trigger a snapshot of the internal state values in the shadow registers and the dedicated scan chain shifts the captured signal state without affecting the system operation of the IC. However, this approach has several deficiencies. First, only a single snapshot can be captured and shifted out with each trigger event. This greatly hampers debugging the IC since there is not much visibility of the system activity around a point of interest identified by the trigger event. Secondly, the snapshots can be taken only of those signals in registers which have a shadow register counterpart. Since a shadow register effectively doubles the circuitry for the register, this approach is very costly to implement on a large scale in the IC.

Another test and debug design for ICs is found in a standard, the IEEE 1149.1 Test Access Port and Boundary-Scan Architecture, which prescribes a test controller which responds to a set of predetermined instructions and an instruction register which holds the present instruction which the controller executes. Each instruction is first loaded into the instruction register from a source outside the IC and then that instruction is executed by the controller. While having some advantages of versatility and speed, the standard still binds test and debug procedures to the world external to the IC and thus, limits its performance.

The present invention recognizes that while the advances in IC technology have helped to create the problems of testing and debugging an IC, the advances also point the way toward solving these problems. In accordance with the present invention, special on-chip circuits are used to observe the internal workings of an IC. These circuits operate at internal IC clock rates so that the limitations of the frequency of signals at the IC input and output (I/O) boundary are avoided. Many more points in the IC system are accessed than is feasible with conventional external test and debug processors. Thus the present invention offers advantages which exceed the straight-forward savings in chip space due to miniaturization. Additionally, the present invention reduces the amount of test logic which might have been required elsewhere on the chip.

The present invention also permits the coupling of probes to internal IC points. The points may be selected from a larger number of internal points that may be observed with an external logic analyzer. Besides the greater observability of the internal operations of the IC, the present invention also improves the accuracy of the observations, as compared to an external logic analyzer.

SUMMARY OF THE INVENTION

To achieve these ends, the present invention provides for an integrated circuit logic blocks, a control unit, a memory associated with the control unit and a plurality of scan lines. The memory holds instructions for the control unit to perform test and debug operations of the logic blocks. The scan lines are responsive to the control unit for loading test signals for the logic blocks and retrieving test signal results from the logic blocks. The test signals and the test signal results are stored in the memory so that the loading and retrieving operations are performed at one or more clock signal rates internal to the integrated circuit. The integrated circuit also has a plurality of probe lines which are responsive to the control unit for carrying system operation signals at predetermined probe points of the logic blocks. The system operation signals are also stored in the memory so that the system operation signals are retrieved at one or more clock signal rates internal to the integrated circuit.

The present invention also provides for an integrated circuit which has an interface for coupling to an external diagnostic processor, a unit responsive to instructions from the external diagnostics processor, a plurality of probe lines coupled to the unit, and a memory coupled to the unit and to the interface. In response to the unit, the probe lines carry sequential of sets of system operation signals at predetermined probe points of the integrated circuit and the system operation signals are stored in the memory at one or more clock signal rates internal to the integrated circuit. The system operation signals are retrieved from the memory through the interface to the external diagnostic processor at one or more clock signal rates external to the integrated circuit. This allows the external diagnostics processor to process the captured system operation signals.

The present invention further provides for a method of operating an integrated circuit which has logic blocks, a control unit, a memory and a plurality of scan lines of the logic blocks. The memory is loaded with test signals and instructions for the control unit and the scan lines responsive to the control unit are loaded with the test signals for the logic blocks at one or more clock signal rates internal to the integrated circuit. The logic blocks are then operated at one or more clock signal rates internal to the integrated circuit and the resulting test signal results are retrieved from the logic blocks along the scan lines at one or more clock signal rates internal to the integrated circuit. The test signal results are stored in the memory at one or more clock signal rates internal to the integrated circuit; and the stored test results signals are processed in the control unit responsive to the stored instructions in the memory to perform test and debug operations of the logic blocks.

BRIEF DESCRIPTION OF THE DRAWINGS

FIG. 3b is a circuit diagram of a test bus connector of FIG. 3a;

FIG. 3c is an exemplary connection of multiple test bus connectors;

FIG. 6a is a circuit which generates an out-of-range detection probe signals for range probes; FIGS. 6b and 6c are the transistor-level circuits of inverters in FIG. 6a.;

DESCRIPTION OF THE SPECIFIC EMBODIMENTS

General Organization of the Present Invention

Figure 1A:
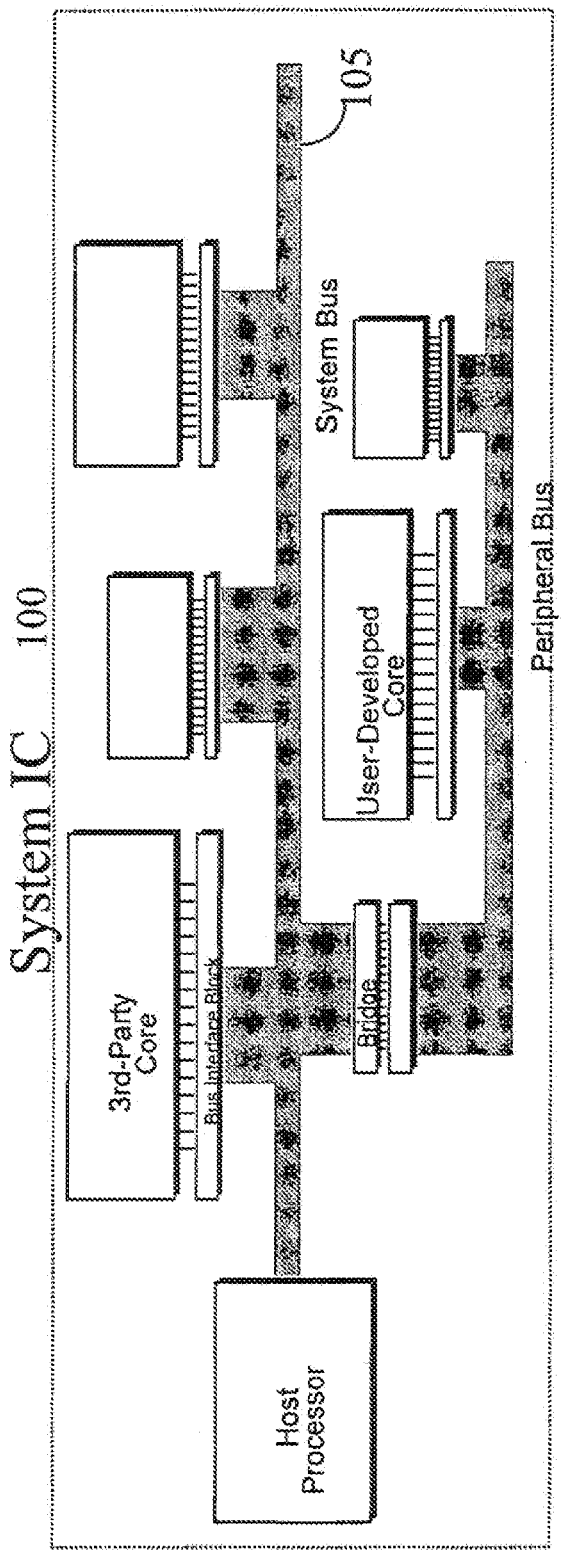
FIG. 1a shows a high-level diagram of an exemplary large and complex integrated circuit.

In accordance with the present invention, a Service Processor Unit (SPU) is incorporated within an integrated circuit. Besides addressing the problems of testing and debugging the IC, the availability of a programmable unit, such as the SPU, which may load or unload the state variables into and from the user-definable logic in an IC, greatly simplifies the problem of resetting the IC and observing its current state. The SPU is implemented in the form of a basic stored-program control unit, such as a microprocessor, with a predefined instruction set, a number of extended function units (EFUs), program, data, and scratch pad memories, plus an input/output circuit for loading and unloading the SPU memories with data/programs from the outside world. This allows the SPU to be programmed to execute a control program which interacts with the various extended functional units to control various test and debug related activities on the IC.

Each EFU is designed to control a specific test or debug feature and the EFU provides the control unit a general, programmable access to that feature. For example, one EFU may be designed to control the execution of serial shift operations along some or all of the internal scan chains of the IC. The other EFUs may be enabled to interact with the scan chains, such as a predetermined algorithm to provide a Built-In Self-Test (BIST) for an embedded Random Access Memory (RAM) block. The existing scan chains load and unload the BIST patterns and results to/from the RAM block. The EFUs provide the control unit with a straight forward, programmable means for controlling the functions of the EFU such that knowledge of low level details of the scan or BIST functions become unnecessary.

With its program and data memories the SPU acts autonomously once its program memory has been loaded with the desired instruction sequence. The SPU's program memory may be loaded with the desired program instructions through the SPU's interface to the external environment. Alternatively, the instructions may be stored in an on-chip Read Only Memory (ROM) that has been provided to work as the SPU's program memory.

In one embodiment of the present invention, an EFU. carries out certain functions of a logic analyzer. A logic analyzer captures and stores signal state values in a digital system following the occurrence of a pre-defined event. The logic analyzer then analyzes the captured data and displays the results for perusal. With the present invention, the capture and storage functions are incorporated into the IC. The EFU which implements these functions captures and stores not a single snapshot but a sequence (i.e., history) of signal values using logic probes which are selectively coupled to desired points in the IC logic circuits. The logic analyzer EFU is configurable to select the location, number and sequential depth of signal channels from a predetermined set of choices. Thus, each logic analyzer channel may be selectively coupled to more than one predetermined capture point by programming the control unit and hence, the EFU. A solution is provided for capturing the history of signal values at the internal points of the IC without having to provide each one of these points with their shadow register counterpart. The captured data are stored in an on-chip Random Access Memory (RAM). Transportation of the captured data out of the IC is performed later for analysis by an external computer which can reformat and display as required for diagnostics. The present invention has the benefit of enhanced data accuracy with minimal cost overhead by separating the signal capture/storage function of a logic analyzer into the IC.

Two different types of logic probes may be used with the logic analyzer EFU. One type of logic probe, termed the digital probe, captures sequences of digital signals from internal points of the IC. Digital signal values flow from the internal capture point to a logic analyzer channel through the digital probe. In its simplest form each digital probe has at least two input ports, a selection means and an output port that is directly coupled to a logic analyzer channel. Digital probes may also be constructed from a series of internal storage elements (i.e., flip-flops or latches) to form a pipeline to move the data from the capture points towards the logic analyzer channels. In this case, the movement of the data along the digital probe flip-flops is synchronized with an on-chip clock signal. Since the clock frequency also defines the maximum capture rate, the particular clock signal is selected based on the maximum desired capture rate. The digital probes used for the logic analyzer EFU operate with the same electrical and timing characteristics of the native signals of the IC. The digital probes are implemented in the same technology, with the same functional logic circuitry, and under the same clock timing, as the rest of the IC. Signals are therefor captured and propagated along the digital probes in exactly the same way as they are operated upon by the functional circuitry of the IC. This assures much greater accuracy of signal states captured by the digital probes. In contrast, logic probes used with an external logic analyzer must use trigger events and signal values that are visible external to the IC. The captured signal values may differ significantly from the original (internal) values.

The logic analyzer EFU may use a second type of logic probe, termed an analog probe, which captures signal events representing the detection of signal integrity conditions, such as ground bounce. Desired signal observation points are coupled to analog detection circuits which produce digital signals when particular signal conditions are detected. The analog probe records these digital signal states in the logic analyzer EFU.

The benefits of the logic analyzer EFU are such that for certain ICs, only the EFU portion of the SPU is implemented on the IC. In this alternate embodiment of the present invention, the digital and analog probes are selectively enabled by a scan-chain which allows specific control signals to be loaded into these probe circuits. The scan chain also carries other control signals to be loaded into a trigger circuit which starts and stops the data capture operations. Once the desired data has been captured into an on-chip RAM, the data is transported outside the IC for subsequent analysis and display.

Implementations of the Present Invention As a starting point, FIG. 1a is a diagram of an exemplary integrated circuit. The IC 100 is complex having a host processor connected by a system bus to various circuit blocks, including a third party core and other blocks adapted to the application of the IC. The IC also has a peripheral bus which is connected to the system bus by a bridge. The peripheral bus is connected to other functional blocks, such as a user-developed core and so on.

Figure 1B:
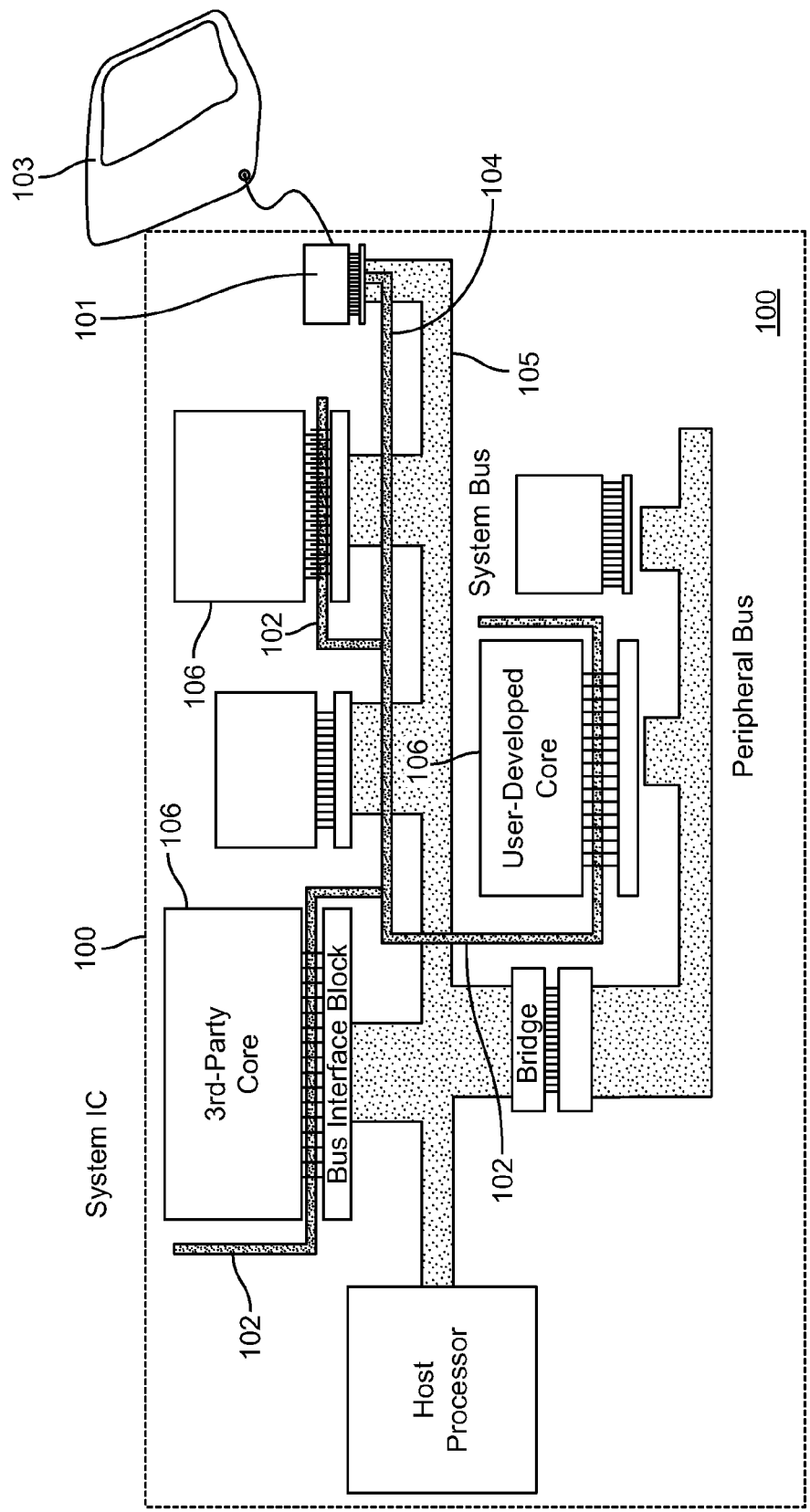
FIG. 1b shows the FIG. 1a integrated circuit with a Service Processor Unit (SPU), according to one embodiment of the present invention.

A preferred embodiment of the present invention to test and debug the complex IC of FIG. 1a is shown in FIG. 1b. Added to the IC 100 is a Service Processor Unit (SPU) 101 which is coupled to the IC system bus 105 and an added test bus 104. Connected to the test bus 104 are test wrappers 102 which provide test communication channels into selected blocks 106. More details of the test bus 104 and test wrappers 102 are provided below. The SPU 101 provides a connection for an external diagnostics console 103 to view and test the internal workings of the IC 100.

Figure 2:
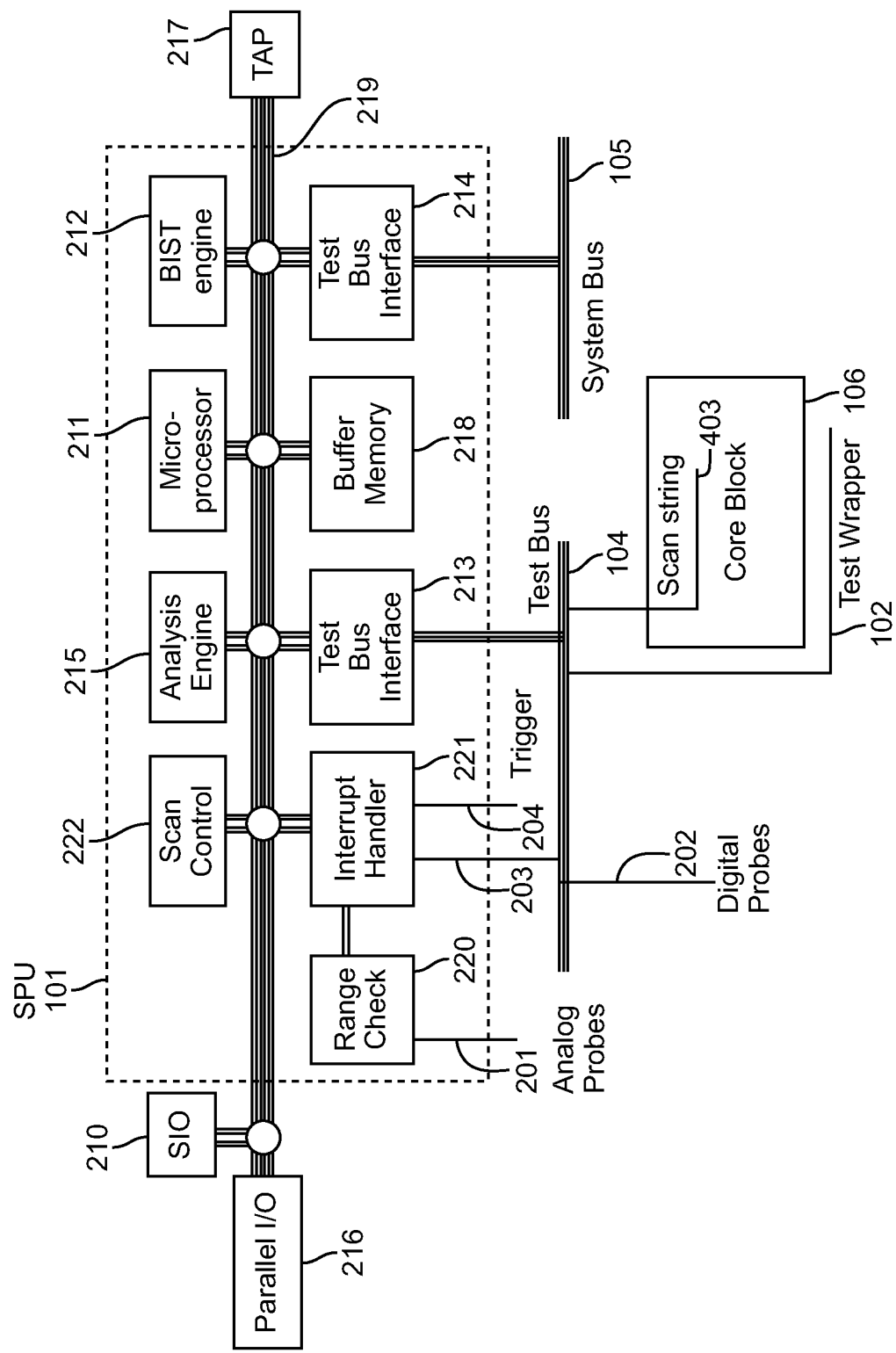
FIG. 2 illustrates one embodiment for the architecture for the SPU of FIG. 1b.

As shown in FIG. 2, the SPU 101 has several extended function units (EFUs), including a control unit, such as a microprocessor 211, a buffer memory unit 218, an analysis engine 215, a scan control unit 222, an interrupt handler 221, which is further connected to a range check unit 220, a system bus interface 214, a test bus interface 213 and a built-in self test (BIST) engine 212, which are all interconnected by a processor bus 219. The various EPUs are coupled to the processor bus 219 in any desired combination and order. To provide communication between the external world and the SPU 101, the bus 219 is also connected to a serial input/output (SIO) interface 210, a parallel input/output interface (PIO) 216, and a test access port (TAP) 217. For example, the coupling between the IC 100 and the external diagnostics console 103, typically implemented using another computer, uses the TAP 217, the SIO interface 210 or the PIO interface 216.

Analog probe lines 201 are connected to the range check unit 220 which processes their values to detect out-of-range conditions which are then signaled to the interrupt handler 221. The interrupt handler 221 also receives signals from trigger event lines 204 directly or from test bus 104 by way of test bus connections 203 to the interrupt handler 221. The signals on the trigger event lines 204 or test connections 203 are used to capture signal state values when predetermined (i.e., triggering) events occur. The interrupt handler 221 passes the captured values to the analysis engine 215. The test bus 104 is further coupled to test wrappers 102, which are individually wrapped around a number of predetermined blocks 106 on the IC 100. Each test wrapper 102 accesses the input and output signals of a block 106. The test bus 104 is also connected to scan string lines 403, which are connected to internal elements of a block 106.

Figure 3A:
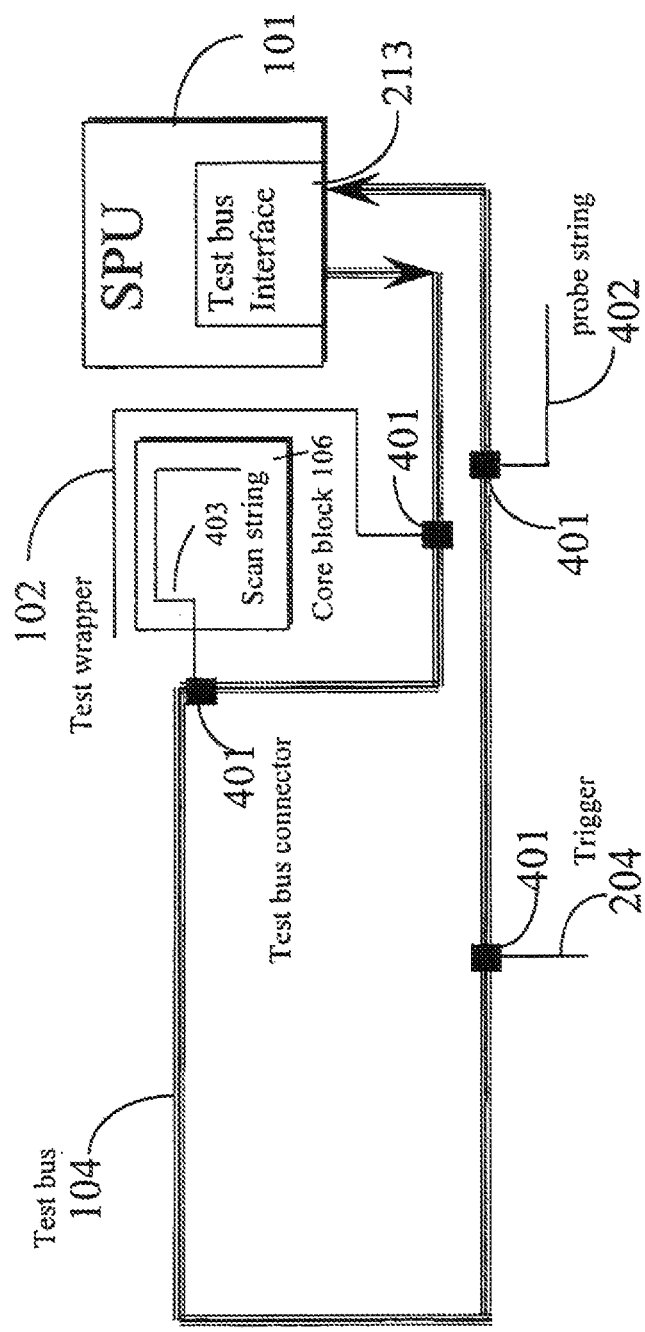
FIG. 3a illustrates the coupling between test wrappers, scan strings, probe strings and range probes to a test bus.

As shown in FIG. 3a, the test bus 104 forms a unidirectional loop with test bus connectors 401 selectively transferring data between the test bus 104 and a test wrapper 102. The test bus 104 is made up of multiple bit lines, where the number of the bits is determined by the requirements of the test system. Through test bus connector 401, the test bus 104 is selectively connected to test wrappers 102, scan string lines 403, probe string lines 402 and trigger lines 204.

Figure 3B:
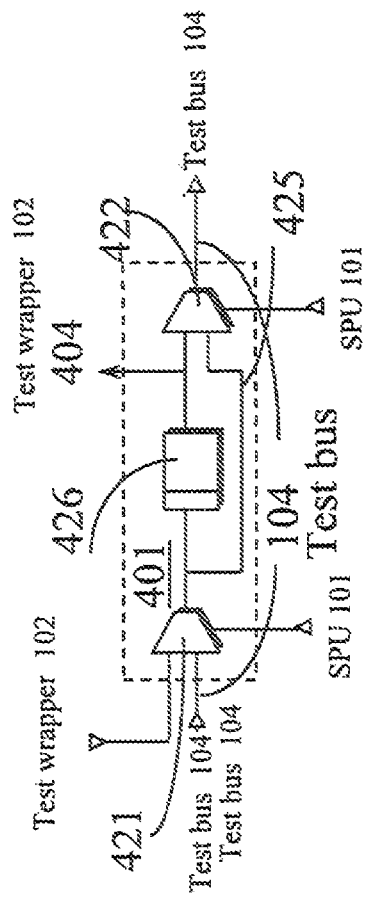

A test bus connector 401 which handles a one bit connection between the test bus 104 and a test wrapper 102 is illustrated in FIG. 3*b*. A first multiplexer 421 has one of its input terminals connected to one of the lines of the test bus 104. The other input terminal is connected to a signal line of the test wrapper 102. The output terminal of the multiplexer 421 is connected to an input terminal of a flip-flop 426 and to an input terminal of a second multiplexer 422, which has a second input terminal connected to the output terminal of the flip-flop 426. The output terminal of the flip-flop 426 is also connected to the line of the test wrapper 102, which is also in the form of a unidirectional loop. The multiplexer 421 selects either the data from the test bus 104 or the test wrapper 102; the second multiplexer 422 selects between the data selected by the first multiplexer 431 or the data captured in the flip-flop 426 to place back onto the test bus 104. These selections are done under the control of SPU 101. The test bus connector 401 is also be used for coupling a trigger line 204, probe string line 402 or scan string line 403 to a test bus 104 by connecting the desired signal line in place of the line of the test wrapper 102 port as shown in FIG. 3*b*.

FIG. 3*c* shows an embodiment of coupling a trigger line 204, probe string 402, test wrapper 102 and scan string line 403 to three lines of the test bus 104. Other possible configurations for the couplings include coupling the test wrapper 102 and scan string 403 onto separate lines of the test bus 104.

Figure 4A:
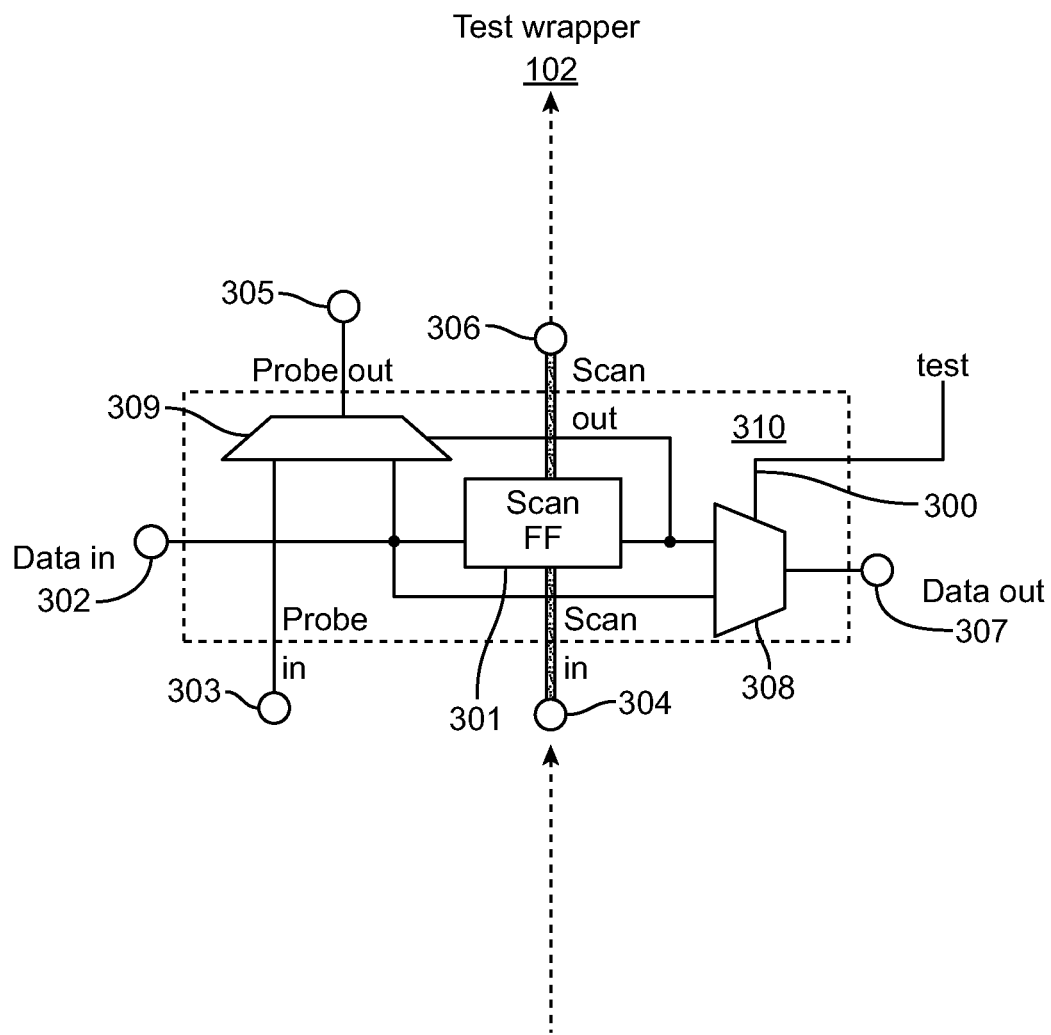
FIG. 4a is a circuit diagram of a block input/output connector for test wrappers for observing test points outside a block along a boundary-scan chain (for example, IEEE 1149.1 standard Test Access Port and Boundary Scan Architecture)

A test wrapper 102 is formed by serially connecting block I/O connector circuits 310. One such circuit 310, which couples an input or output signal of a block 106 to the test wrapper 102, is illustrated in FIG. 4*a*. The connector circuit 310 has a scan-in terminal 304 and a scan-out terminal 306. The scan-in terminal 304 of one circuit 301 is connected to the scan-out terminal 306 of another circuit 301 to form the serial chain of a test wrapper 102. The connector circuit 310 also has a data-in terminal 302 and a data-out terminal 307 which provide an interstitial connection between a block 106 and the rest of the IC 100. In the normal operation of the IC, the connector circuit 310 provides a simple path between the block 106 and the rest of the IC 100. If the connector circuit 310 is to provide an input signal to the block 106 during test operations, the data out terminal 307 is connected to the block 106 and the data in terminal is connected to the rest of the IC 100. If the block I/O connector circuit 310 is to receive an output signal from the block 106 during test operations, the data-out terminal 307 is connected to the rest of the IC 100 and the data-in terminal is connected to the block 106. The connector circuit 310 also has a probe-in terminal 303 and a probe-out terminal 305 which provide a path for probe signals from selected portions of the block 106 through the connector circuit 310 to observe operations in the block 106.

The elements of the connector circuit 310 include a scan flip-flop 301 and two multiplexers 308 and 309. The data-in terminal 302 and the scan-in terminal 304 form the inputs to the flip-flop 301. The output from the flip-flip 301 include the scan out terminal 306 and one input to the multiplexer 308 having an output which forms the data-out terminal 307. The second input to the multiplexer 308 is connected to the data-in terminal 302, which is also connected to one input to the multiplexer 309. The probe-in terminal 303 forms a second input to the multiplexer 309 whose output forms the probe-out terminal 305. The control input of the multiplexer 309 is the output of the scan flip-flop 301 (and is connected to one input of the multiplexer 308). The control input of the multiplexer 308 is a test control line 300 from the control unit 311 of the SPU 101. The control signal on the line 300 selects whether the functional signal at data-in terminal 302 or the signal held in the scan flip-flop 301 is passed onto the data-out terminal 307. When the control signal of the line 300 signal is not-asserted, i.e., normal mode, there is normal operational signal flow between the data-in terminal 302 and the data-out terminal 307. On the other hand, when the control signal on the line 300 is in asserted state, i.e., test mode, the current state of the scan flip-flop 301 is passed onto the data-out terminal 307; the data-in terminal 302 and the data-out terminal 307 are isolated from one another. The state stored in the scan flip-flop 301 is also controls whether the signal at the data-in terminal 302 or the probe-in terminal 303 is passed onto the probe-out terminal 305. In this manner, data from another probe point which is connected to the probe-in terminal 303 are selectively passed onto the probe-out terminal 305. The signal state in the scan flip-flop 301 value is controlled and observed using regular scan operations of the test wrapper 102 through the scan-in and scan-out terminals 304 and 306. Of course, if observation of an input or output signal of the block 106 by a probe string 402 is not required, the multiplexer 309 can be eliminated from the circuit 310.

Figure 4B:
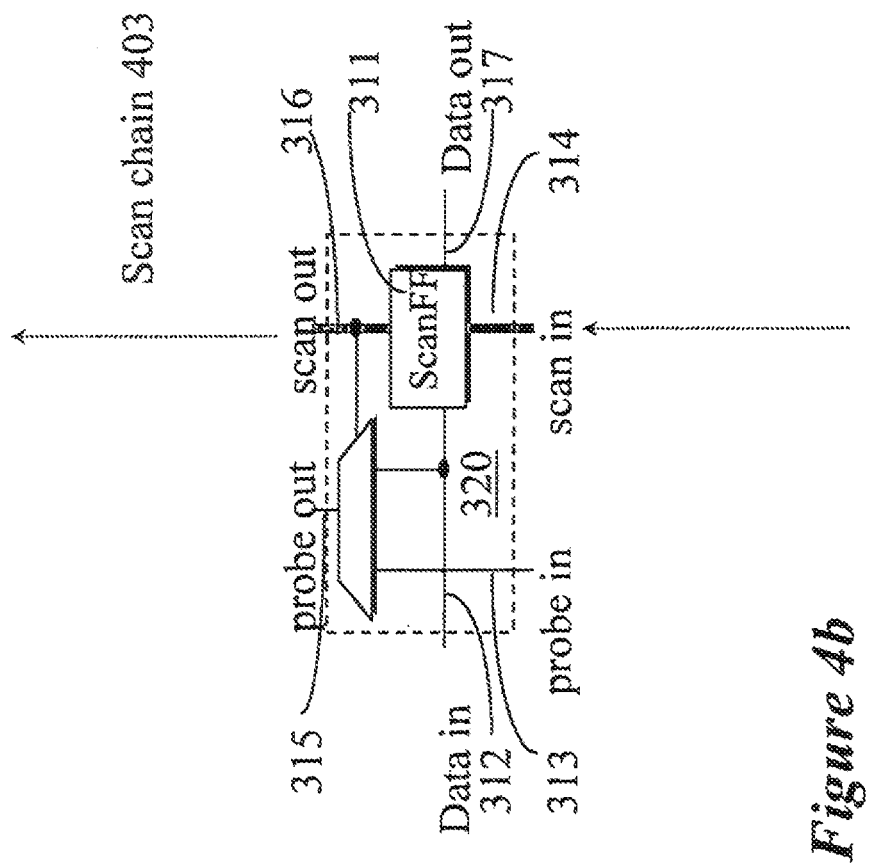
FIG. 4b is a circuit diagram of a block scan connector for scan strings for observing test points inside a block along a scan chain.

A scan string 403 is formed by serially connecting block scan connector circuits 320. One such circuit 320, which couples an internal element of a block 106 to the scan string 403, is illustrated in FIG. 4*b*. The connector circuit 320 has a scan-in terminal 314 and a scan-out terminal 316. The scan-in terminal 314 of one connector circuit is connected to the scan-out terminal 316 of another connector circuit 320 to form a serial scan string 403. The block scan connector circuit 320 also has a data-in terminal 312 and a data-out terminal 317 which provide an interstitial connection between internal elements of the block 106. In the normal operation of the IC 100, the connector circuit 320 is a simple path between the internal elements in the block 106. The connector circuit 320 also has a probe-in terminal 313 and a probe-out terminal 315 which provide a path for probe signals from selected portions of the block 106 through the connector circuit 320 to observe operations in the block 106.

Figure 5:
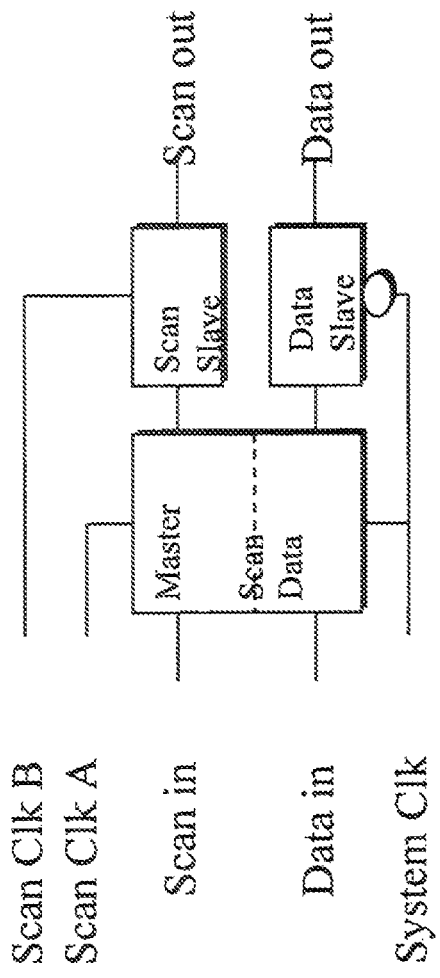
FIG. 5 is a circuit diagram of a scan flip-flop in the FIG. 4b circuit diagram.

The block scan connector circuit 320 has a scan flip-flop 311 and a multiplexer 319. The data-in terminal 312 and the scan-in terminal 314 form the inputs to the scan flip-flop 311. The output from the flip-flip 311 include the scan out terminal 316 and the data-out terminal 317. The data-in terminal 302 is also connected to one input to the multiplexer 319. The probe-in terminal 313 forms a second input to the multiplexer 319 whose output forms the probe-out terminal 315. A special circuit is used for the scan flip-flop 311 (and the flip-flop 301 of FIG. 4*a*). The circuit, which is shown in FIG. 5 and is found in previous IC scan designs, has separate scan-slave and data-slave sections. The separation allows a state signal which has been scanned into the scan flip-flop 311 to remain unaffected by functional clock pulses that cause the flip-flop 311 to capture signals on the data in terminal 312 so that they appear in the data-slave section and on the data out terminal 317. The connector circuit 320 acts as a simple conduit for signals within the block 106. At the same time, the previously scanned-in signal, which appears in the scan-slave section, selects whether signals at the data in terminal 312 or the output from another probe point which has been connected to the probe-in terminal 313 is to be passed onto the probe-out terminal 315. A probe string 402 is created. Of course, if an internal scan string 403 need not be connected to a probe string 402, the multiplexer 319 can be eliminated from the circuit 320.

A probe string 402 is formed by serially connecting the probe-in terminal of a connector circuit 310 and 320 to the probe-out terminal of another connector circuit 310 and 320. The probe string 402 typically has a set of selectively connected probe points. However, only one probe point along each probe string 402 may be actively probed at any given time. Thus the IC designer selects the probe points which are to be connected along the same probe string 402 and determines the total number of probe strings 402 that are to be connected to the individual bits of the test bus 104. This structure allows the IC designer great flexibility to optimize the number of test bus 104 lines with respect to the number of simultaneously observable probe points in the IC.

Figure 6C:
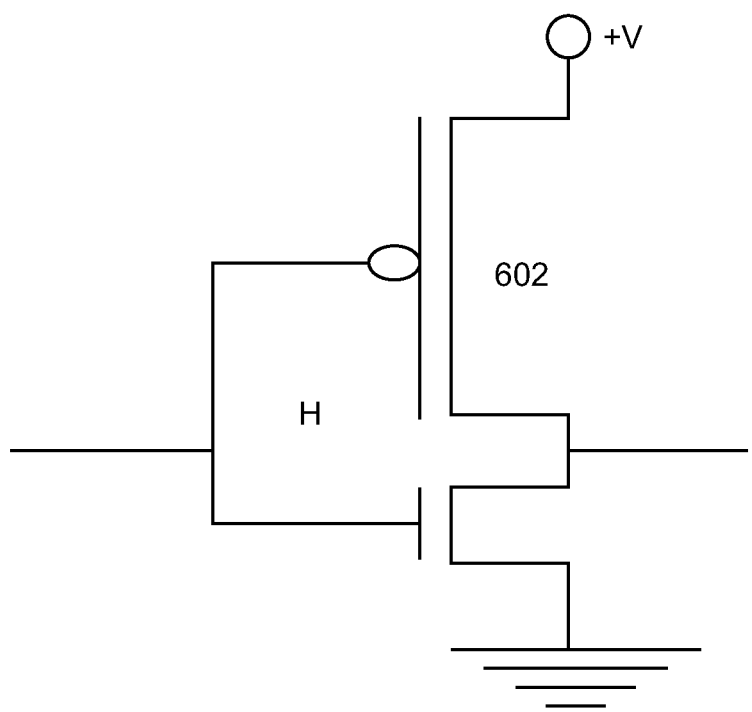

The probes described above are digital probes. Two analog probes are illustrated in FIGS. 6a, 6b, 6c and 7. The range check unit 220 receives inputs from the analog probes that comprise signals on a threshold check line 600 and a ground bounce line 700. The unit transmits these signals to the SPU 101. FIGS. 6a, 6b and 6c show the circuit which generate the signal for the threshold check line 600. The circuit is used for detecting extended intermediate voltage levels. Such voltage levels are most likely to occur on an on-chip bus, which is in contention among multiple circuit drivers. The analog probe has two inverters 601 and 602, which are both coupled to an Exclusive-NOR logic gate circuit. FIG. 6b is a transistor diagram depicting the low threshold inverter 601, and FIG. 6c is a transistor diagram depicting the high threshold inverter 602. These inverters 601 and 602 exhibit switching properties characteristic of a very low internal voltage, and a very high internal voltage device, respectively. Normally, the circuit in FIG. 6a has a logic one (1) output level, but during transitions of the input signal, the outputs of inverters 601 and 602 may remain in opposite states for a period sufficient to cause the circuit to go to a logic zero (0) output level before returning to the logic one (1) output level. This negative pulse can be captured by the SPU 101.

Figure 7:
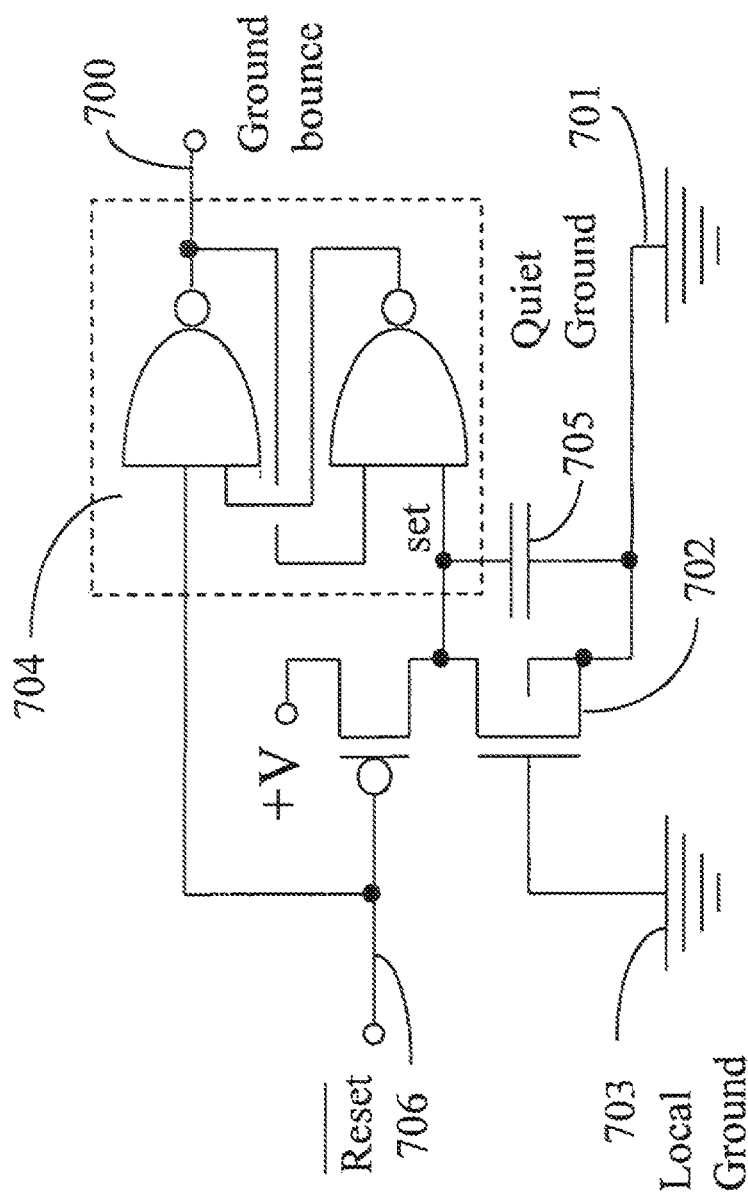
FIG. 7 is a circuit which generates ground-bounce detection probe signals for range probes.

FIG. 7 shows a schematic diagram of a ground bounce detector circuit which generates the signals for a ground bounce line 700. In this circuit, a quiet (and true) ground terminal 701 is connected to an N-channel transistor 702, which gate is driven by a local ground connection terminal 703. A periodic clock on a Reset terminal 706, which is controlled from the range check 220, clears a pair of NAND gates configured as a SR latch 704, and charges a capacitor 705 having one terminal connected to the Set input of the SR latch. The second terminal of the capacitor 705 is connected to the quiet ground terminal 701. The N-channel transistor 702 which is gated by the local ground discharges the Set line of the SR latch 704, which flips the state of the SR latch 704 if the local ground falls above threshold. For example, a ground spike on the local ground may drive the local ground below threshold. The frequency and duty cycle of the Reset signal determines the magnitude and duration of a ground spike on the local ground to trigger the probe. A variety of frequencies and duty cycles are created by the range check 220 to determine the severity of ground spikes. When the probe is triggered, the probe produces a negative (0) value until reset by the Reset signal on the terminal 706.

Figure 8:
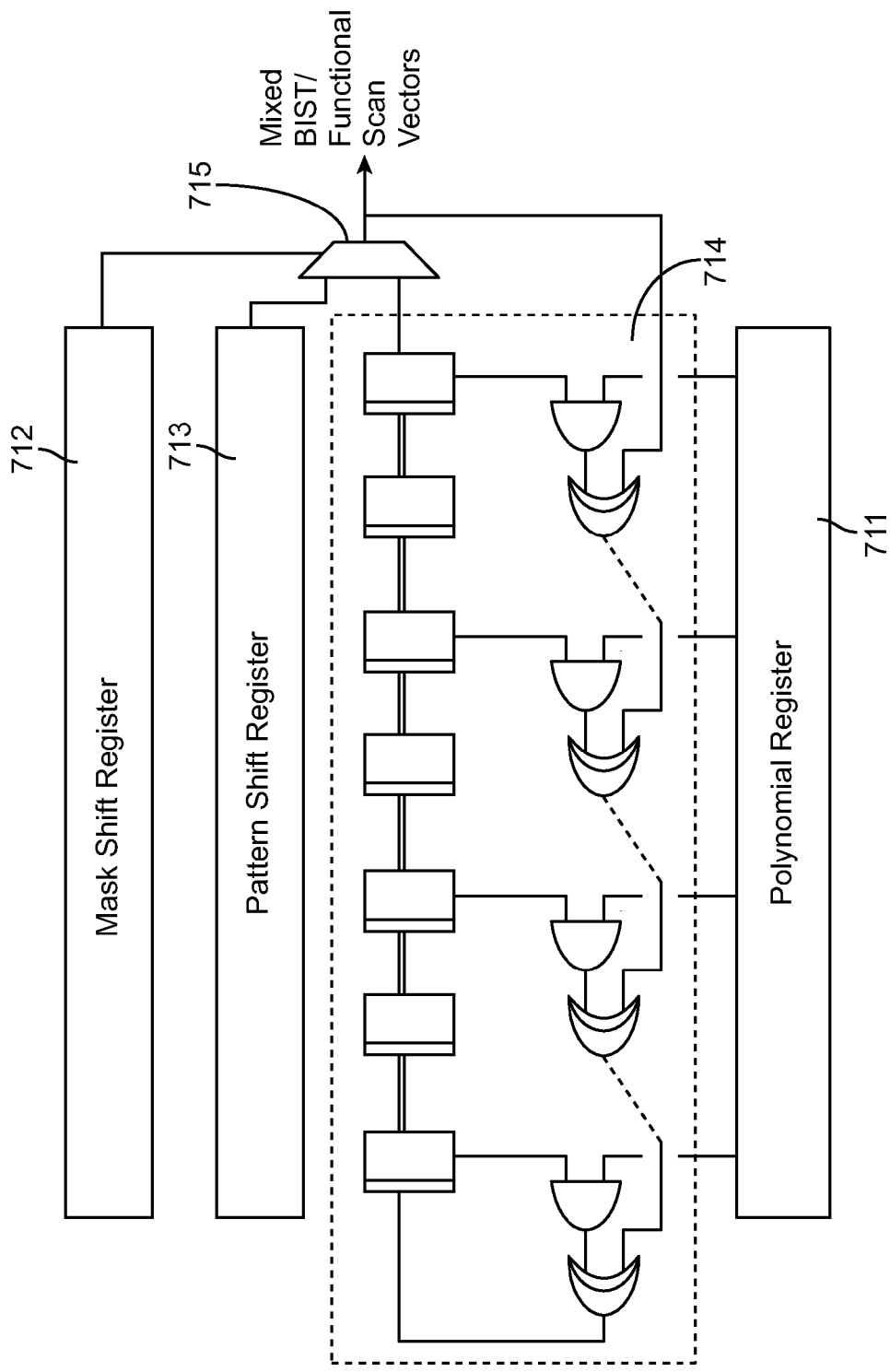
FIG. 8 is a block diagram of a Built In Self-Test (BIST) engine of the FIG. 2 SPU.

Returning to the components of the SPU 101, FIG. 8 is a preferred embodiment of the BIST engine 212. A polynomial register 711 identifies the bits in a linear feedback shift register (LSFR) 714 which are used to form an Exclusive-OR (XOR) function which generates pseudo-random values. The polynomial register 711 is set by the microprocessor 211, which also initializes contents of the LSFR 714. The output of the LSFR 717 is connected to the inputs of a multiplexer 715 which also receives the outputs of a mask shift register 712 and a pattern shift register 713. The output of the multiplexer 715 is an input to the LSFR 714. The mask shift register 712 identifies the bit positions whose values are selected from predetermined bit patterns in mask shift register 713 versus the bit positions which receive the pseudo-random values generated by the LFSR 714. The output of the multiplexer 715 is a combination of built-in-self-test and functional scan vectors. These features are useful because random vectors work well only when the controls allow the random vectors to exercise most of the IC section under test. If there are more than a few control lines, the probability of properly exercising the logic under test with random vectors is very low. These features also allow the SPU 101 to generate regularly repeating patterns; for example, periodic patterns that may be useful in a memory test may be generated by the SPU 101 that may output the data to the section of logic under test via the test bus or the system bus, whichever has been provided with a connection to the SPU 101.

Figure 9A:
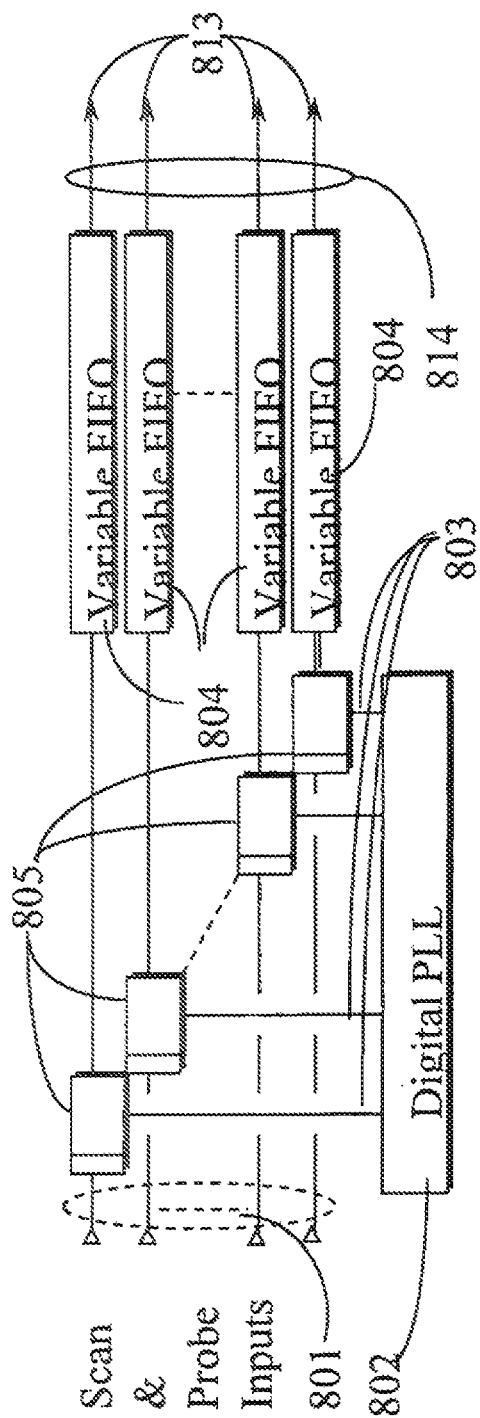
FIG. 9a is a block diagram of an input aligner portion of Analysis Engine of the FIG. 2 SPU.

Another EFU of the SPU 101 is the analysis engine 215. FIG. 9a shows an embodiment of the analysis engine 215 which, under the control of the microprocessor 211, captures logic signals from the test bus 104. This is achieved by first setting either the scan flip-flops 301 of the block I/O connector circuits 310 (FIG. 4a) or the scan flip-flops 311 of the block scan connector circuit 320 (FIG. 4b) so that a boundary connection or an internal point connection of the target block 106 is selected for probing, respectively. Next, all flip-flops along the same probe string 402 are programmed (by the SPU 101) so that only signals from the selected probe point are allowed to flow through the probe string 402 and arrive at the test bus connector 401. The multiplexer 421 and the multiplexer 422 in the test bus connector 401 (FIG. 3a) are controlled by the SPU 101 so that the signals on the probe string 402 are passed along to the test bus 104. Finally, all remaining test bus connector circuits 401 along the same bit line of the test bus 104 are controlled by the SPU 101 so that they pass the probe signals along test bus 104. This allows the selected probe signal to arrive at the analysis engine 215 where it is captured for subsequent off-line analysis. The input terminals of a plurality of flip-flops 805, one for each bit line of the test bus 104, form the input port 802 of the analysis engine 215. A digital phase locked loop (PLL) 802 has selectable clock outputs 803 to each flip-flop 805 to tune when the data from each probe point is to be captured. The output terminal of each flip-flop 905 is connected to the input terminal of a variable First-In-First-Out shift register (FIFO) 804.

Figure 9B:
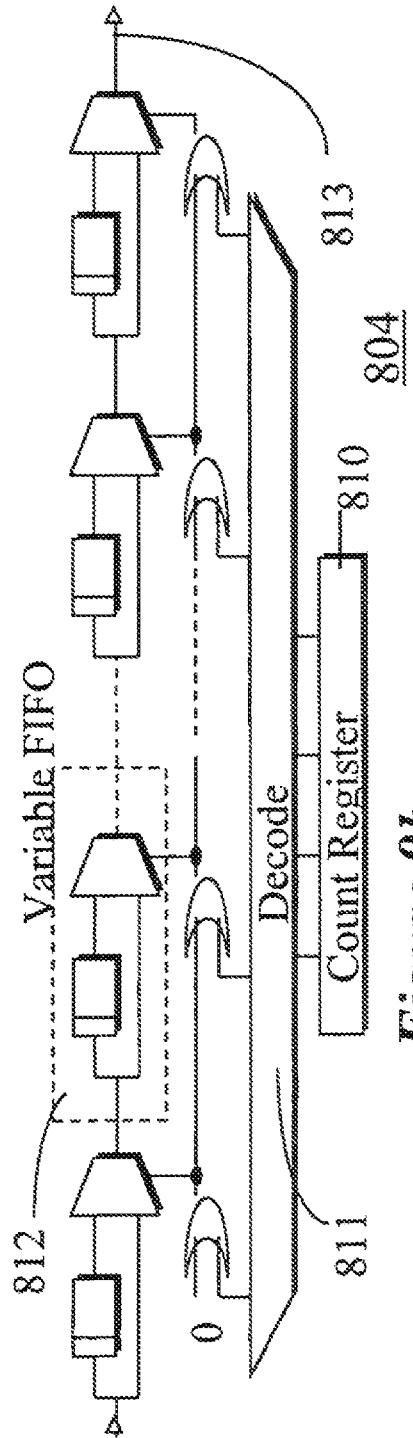
FIG. 9b is a detail of the FIG. 9a Analysis Engine's input aligner.

FIG. 9b shows the circuit details of each variable First-In-First-Out shift register (FIFO) 804, each having a number of serially-connected register stages 812. Each register stage 812 has a multiplexer which, under control of a decoder 811, selects between the signal held in a flip-flop of that stage or the incoming signal to the stage to place on the stage's output terminal. The shift depth of each variable FIFO 804 is programmable by the SPU 101 by setting a count register 810 for each bit feeding the analysis engine 215. The value in the count register 810 is decoded by the decoder 811. The result controls the number of register stages 812 which are bypassed. This compensates for the path delay differences among the different probe points by realigning capture times of signals captured in the analysis engine 215.

Figure 9C:
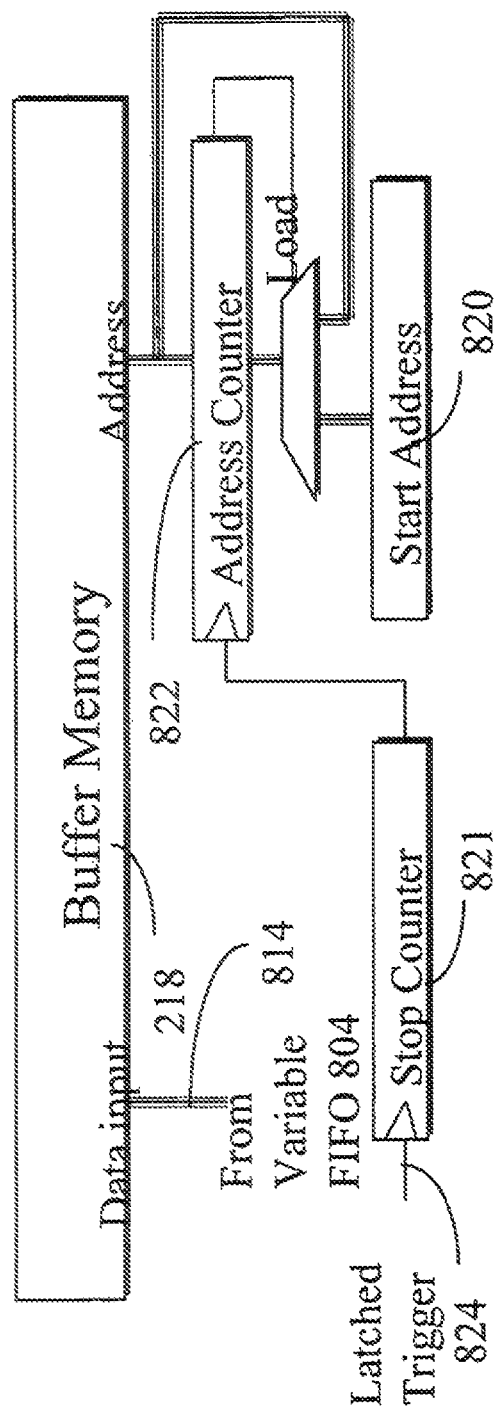
FIG. 9c is a block diagram of the Analysis Engine's memory addressing structure.
Figure 9D:
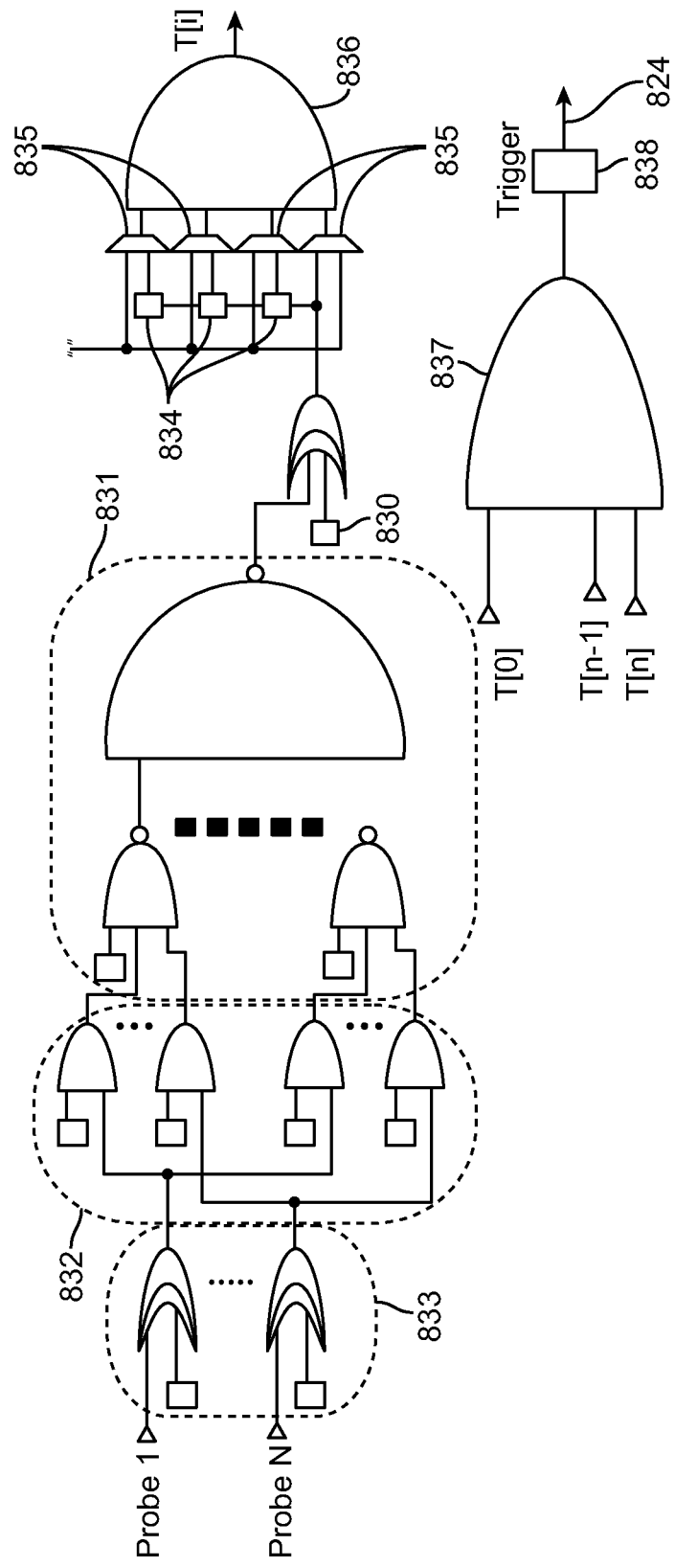
FIG. 9d is a block diagram of the trigger logic portion of the Analysis Engine.

The analysis engine 215 also has trigger logic which controls the capture of data. FIGS. 9c and 9d show sections of the trigger logic, a programmable circuit which detects one or more events to stop the analysis engine 215 from capturing new data. The data that has been captured up to that point is preserved in the buffer memory 218 of the SPU 101. The buffer memory 218 resides in the same address space as the RAM used by the SPU 101 but may be mapped to use high memory space in order to prevent interference with the instructions and data stored in low memory space. When the analysis-engine 215 collects data, it may be allowed to write over old data, keeping only as many most-recent cycles of data as the buffer memory 218 can hold. The size of the buffer memory 218 for the analysis engine 215 is determined by the designer of the IC.

The trigger logic has a start address counter 820 and a stop counter 821, which are shown in FIG. 9c. These counters are loaded by the microprocessor 211. The trigger circuit also has an address counter 822 which is designed to overflow at the highest memory address of the buffer memory 218. At that point the start address is reloaded with the beginning address of the high memory space which is reserved for the buffer 218. This converts a random access memory into a FIFO register. The stop counter 821 decrements when a latched trigger signal line 824 becomes set. Subsequently the analysis engine 215 collects data into the buffer memory 218 from the variable FIFOs 804 for as many cycles as defined by the value loaded into the stop counter 821. The system IC designer uses the buffer memory size and the value in the stop counter 821 as two parameters to control the amount of data collected before and after an event has been detected.

Also part of the trigger logic is a circuit which generates the triggering signals on the trigger signal line 824. As shown in FIG. 9d, the generating circuit is structured to form Boolean AND-OR logic 831 out of individually selectable terms 832. The terms 832 are fed from a polarity programming logic circuit 833 that accepts individual trigger variables, Probe 1 through Probe N. In addition, the true or the complemented value for the output function can be selected through a final level circuit 830. In one embodiment (shown in FIG. 9d), the result is also shifted into three successive flip-flops 834. Each of the flip-flops 834 drives one input of each of a plurality of multiplexers 835. The other inputs of the multiplexers 835 are set to a logic one (1) level. Each multiplexer 835 is individually controlled through programmable bits and the multiplexer outputs are logically ANDed together to form a signal, T[i], which represents the presence of the trigger condition over four consecutive clock periods. The output from the AND gate 836 is passed to an AND gate 837 with inputs from the corresponding AND gates 836 of duplicate circuits that produce T[0], T[1], through T[n] signals. The output of AND gate 837 is stored in a latch 838 to form the latched trigger signal on the line 824. Once the signal is set, the latched trigger signal maintains its value until it is reset through reprogramming by the microprocessor 211. In other embodiments, there may be more or fewer latches, and additional logic to make adjustments to the phases (i.e., the relative clock cycle when signal is received) of the individual signals.

Figure 10:
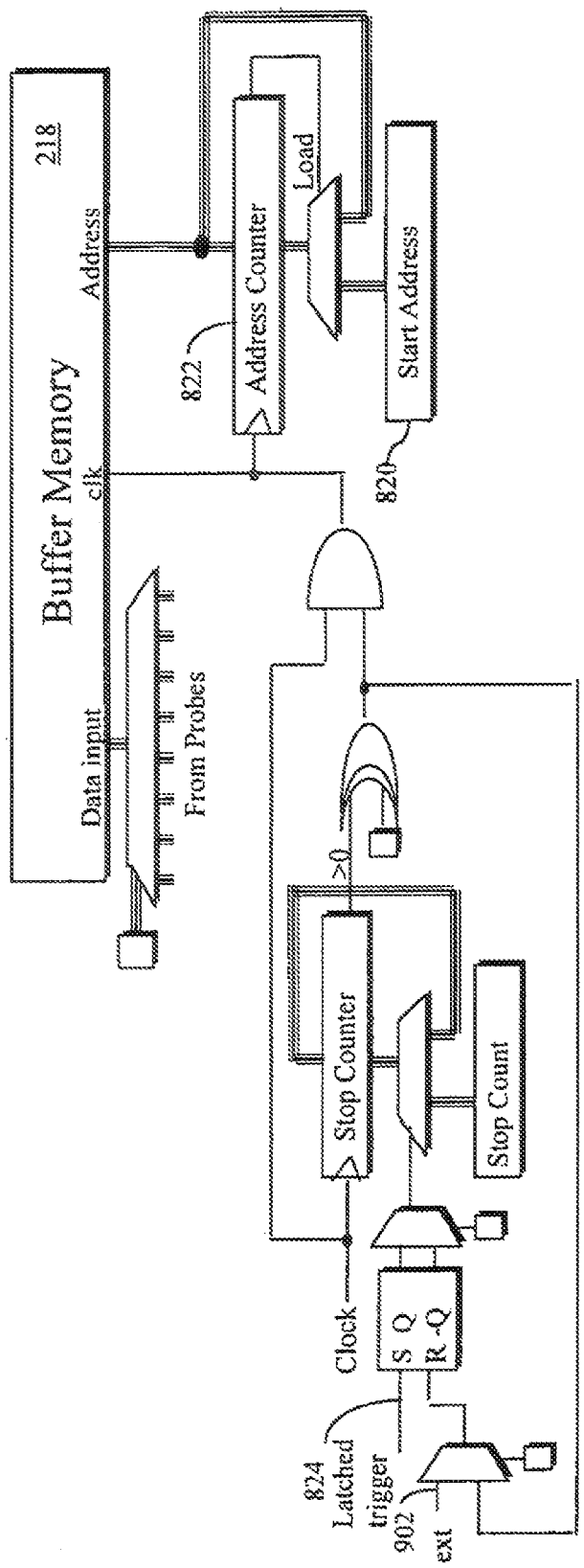
FIG. 10 is a block diagram of another embodiment of the Analysis Engine's memory addressing structure.

Another embodiment of the trigger logic is shown in FIG. 10. This embodiment provides for the capability of reversing the data capturing function of the analysis engine 215 from continually capturing new data until the trigger is detected, to not capturing any data until a trigger is received. In the latter case, each time a trigger signal on the line 824 is received, the analysis engine 215 captures new data for a preprogrammed number of cycles and then stops until the next latched signal on the line 824 is received. To enable this mode of operation, the trigger circuit shown in FIG. 10 causes the previous trigger condition to be cleared so that it may be recognized again. This mode is very useful since it enables the capture of signals around (i.e., before and after) multiple occurrences of trigger conditions. The buffer memory 218 is utilized more efficiently as the storage of unwanted cycles of data between the trigger points is not required. It is also possible to program the trigger logic so it uses an externally generated trigger condition 902 in place of an internally programmed event.

Program instructions and initial data values for executing programs to implement the functions of the SPU 101 are loaded from the diagnostics console 103 (see FIG. 1b) into the buffer memory 218 of the SPU 101. Some of these programs may access the system bus 105 or the test bus 104. A program can control which test wrapper 102 is accessed by using the test bus interface 213 in order to set control signals on the test bus 104. This allows the SPU 101 to read data from a test wrapper 102 via the test bus 104 into the buffer memory 218 and then send said data out to the diagnostic console 103. Typically, a separate program executed on the diagnostic console 103 displays this information in a human readable format as may be appropriate for the given application.

Programs executed by the SPU 101 can also read data from the diagnostics console 103 via the SIO interface 210 or TAP interface 217, as shown in FIG. 2b, and write data out to individual scan flip-flops on the test wrappers 102 via the test bus 104. Significant processing, for example, expansion, compaction, or intermediate storage of data can be done by the SPU 101 utilizing the buffer memory 218. In other embodiments, control functions may be supplied directly from the TAP interface 217 or SIO interface 210 to the analysis engine 215 or BIST engine 212, via the processor bus 219 without involving the microprocessor 211. The SPU 101 may be coupled to either the system bus 205, or a separate test bus 104, or both. The coupling to the diagnostics console 103 may be via the TAP interface 217 or the SIO interface 210. The test bus 104 may be coupled to one or more test wrappers 102.

Figure 11:
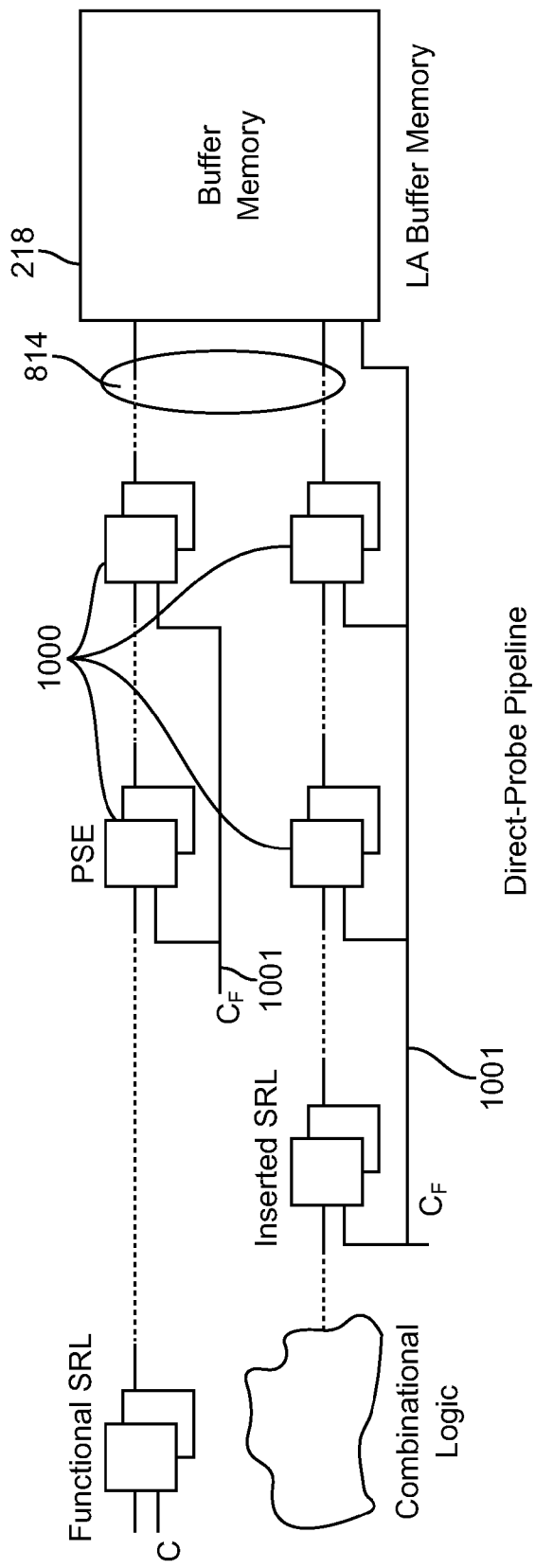
FIG. 11 shows a probe string connection of probe points to the buffer memory using logic analyzer channels that are implemented with probe storage elements (PSE)

Another embodiment of the invention is defined in which the SPU 101 does not include an embedded microprocessor 211. In this case, the analysis engine 215 and the BIST engine 212 can access the buffer memory 218 and system bus interface 214 directly, following instructions received from the external diagnostics console 103. In this case, the loading of the configuration information and transfer of data to and from the analysis engine 215 is controlled using hardwired control signals. In this embodiment, the analysis engine 215 is implemented in the form of an on-chip logic analyzer (OLA) which captures sequential snapshots of sets of signals. The selected signals form the digital probes 202. The selections are achieved by coupling the signals for digital probes 202 to the channels of the analysis engine 215 and turning-on enabling circuits, if provided, to allow the signals on the digital probes 202 value to be captured onto channels of the logic analyzer 215. As shown in FIG. 11, the channels of the logic analyzer 215 are formed from probe storage elements (PSE) 1000 to form a distributed serial shift register which acts as a pipeline to move data captured at a probe point towards the end of the logic analyzer channel where the data are stored in buffer memory 218. Each channel of the analysis engine 215 contains zero or more number of PSEs 1000 which are clocked by a common periodic clock signal labeled "Cf" on a clock signal line 1001. The clock signal is chosen (at design time) from among the fastest frequency of clock signals which are used in generating source signals to be captured by the probes. This way all signals captured on the analysis engine 215 channels arrive at the end of the channels after a fixed, predetermined number of clock cycles so that their cycle relationship to one another is preserved, regardless of the length (i.e., number of bits) of the individual channels of analysis engine 215.

Subsequently, after the captured data has been transported to the external diagnostics console 103, software processes use the number of PSEs 1000 on each channel of the analysis engine 215 to align the data with respect to one another. The lengths (i.e. number of bits) of the serial shift registers on the individual channels of the analysis engine 215 are determined at design time so that signal delays due to physical distances among the PSEs 1000 are sufficiently short to allow data to be shifted between consecutive bits of the shift registers in a single clock cycle. If necessary, the number of stages of the shift registers may be increased to satisfy this condition. Each channel of the analysis engine 215 is coupled to a different data input port of the buffer memory 218. The collective data applied to the ports of the buffer memory 218 is written to an address in memory which is identified by a common address register 822 that advances under control of the periodic clock signal "Cf" on the line 1001.

Figure 12:
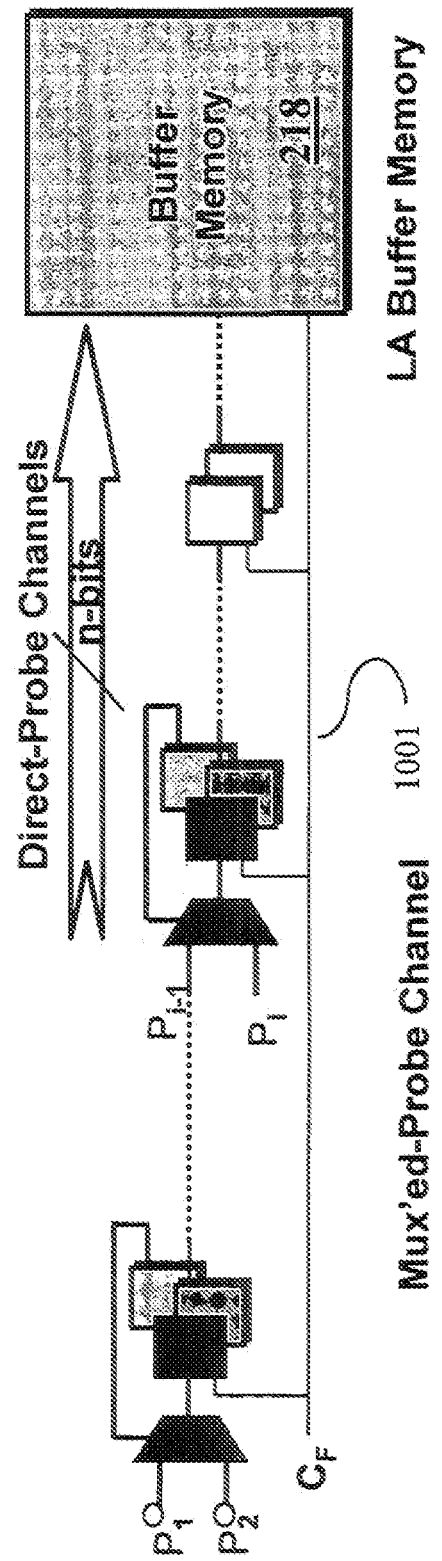
FIG. 12 shows an alternative probe string, connection with improved multiplexed PSEs which combine probe selection and data capture functions.

FIG. 12 shows a preferred embodiment of a channel of the OLA 215 which uses multiplexed PSEs 1000 to combine the selection of probe points and pipelining captured data into a single, efficient design. This enables the coupling one PSE 1000 to two probe points or another PSE 1000. Scan operations shift a control signal into the PSE 1000 to program itself to select one or the other of its input ports.

Figure 13:
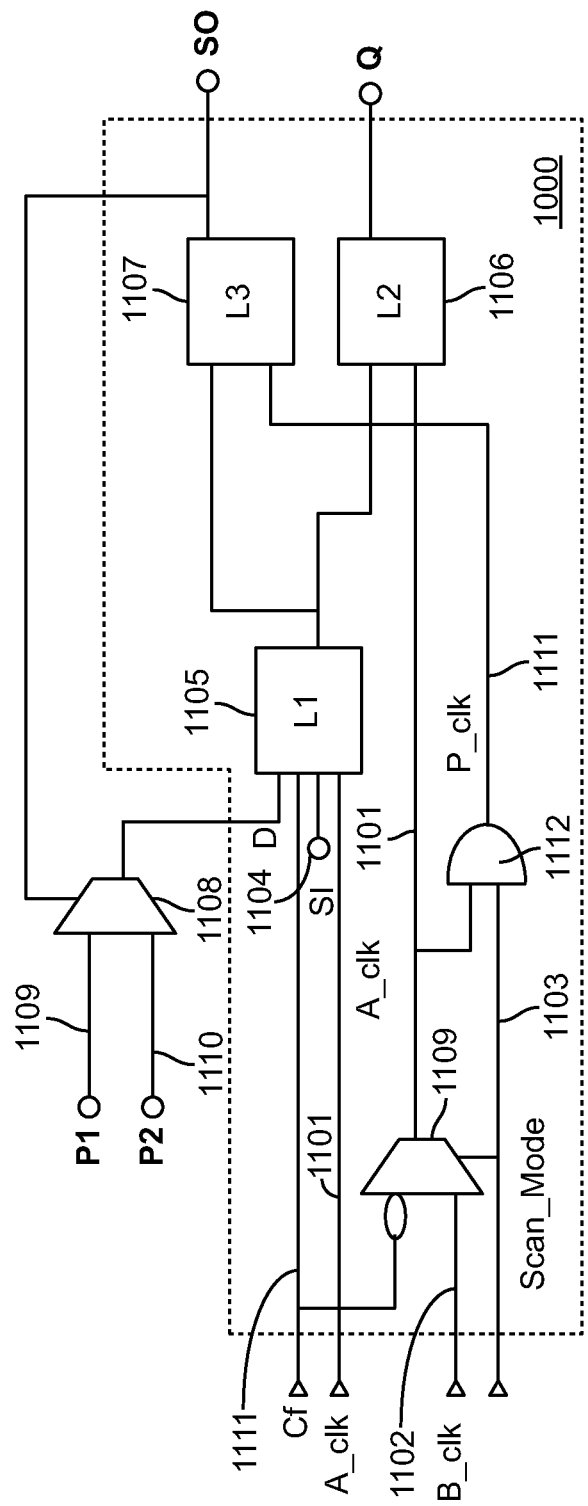
FIG. 13 is a block diagram of the improved PSE of FIG. 12.

The details of a multiplexed PSE are shown in FIG. 13. The PSE 1000, illustrated by a dotted line, is connected to a multiplexer 1108 which has two input terminals connected to two input probe paths, P1 and P2, for the logic analyzer channels. Besides the probe clock signal line 1001, which carries the Cf signal, the PSE 1000 is connected to a first scan clock signal line 1101, which carries an A_clk signal, a second scan clock signal line 1102, which carries a B_clk signal, and a scan control line 1103, which carries a Scan_mode signal. The PSE 1000 has three latches 1105, 1106 and 1107. The output terminal of the latch 1105 is connected to one input terminal of the latch 1106 and to one input terminal of the latch 1107. One input terminal of the latch 1105 is connected to the output terminal of the multiplexer 1108 and a second input terminal of the latch 1105 forms a scan data input terminal 1104, SI. The output terminal of the latch 1107 forms a scan data output terminal, SO, and is also connected to the control terminal of the multiplexer 1108. The output terminal of the latch 1106 forms an output probe path, Q, for the logic analyzer channels.

The scan clock signals, A_clk and B_clk respectively, and the Scan_mode signal configure the PSE 1000. For serial shift operations, the serial input (SI) on the line 1104 is captured into the latch 1105 when the A_clk signal is applied and the output of the latch 1105 is captured into the latch 1106 when the B_clk signal is applied. If the Scan_mode signal on the line 1103 is set to a logic 1, the B_clk signal on the line 1102 is also passed through a multiplexer 1109 and an AND gate 1112 to the latch 1107 by a clock signal line 1111. Thus, non-overlapping A_clk and B_clk signals on the clock signal lines 1101 and 1102 respectively clock serial shift operations in the PSE 1000. Signals scanned into the latch 1105 through line 1104 are also scanned into the latch 1107 (and the latch 1106) and the SO output terminal. This completes the programming of the PSE 1000 such that value that has been loaded into the latch 1107 controls input multiplexer 1108 which selects between two input ports 1109 and 1110. Once the PSE 1000 has been programmed, the Scan_mode signal on control line 1103 signal is set to and maintained at logic 0 until the PSE 1000 is programmed with a new value. When the Scan_mode signal is set to logic 0, the PSE 1000 performs its normal data capture function using the clock signal Cf on the line 1001. The Cf clock signals are passed by the multiplexer 1109 to the latch 1106 by a clock signal 1110. The latch 1106 captures the signals from the latch 1105 and the multiplexer 1108 at the Cf clock rate and passes the signals out to the Q output terminal. The multiplexed-PSEs shown in FIGS. 12 and 13 build cost efficient logic analyzer channels.

Once enabled, the analysis engine 215 captures new values first into the flip-flops along the OLA channels and subsequently into the buffer memory 218 using trigger signals that have been pre-programmed and implemented as shown in FIGS. 9c, 9d and 10.

In one mode of operation of the IC 100 shown in FIG. 1b, the human engineer may use the diagnostics console 103 to initialize both of the system logic and the SPU 101. In this manner, the SPU 101 may be programmed to perform logic analyzer functions and specific probe points may be enabled so that a history of data values appearing at the selected probe points can be captured by SPU 101. Additionally, the trigger logic shown in FIGS. 9 and 10 may be programmed to select a desired trigger event in order to stop the data capture operations. Next, the diagnostics console 103 invoke the IC 100 to execute its normal system operations. If and when the selected trigger event is detected and the analysis engine 215 has captured the required data, the diagnostics console 103 instructs the SPU 101 to transfer the captured data values out of the IC 100 and into the diagnostics console 103 where the data may be formatted and presented for analysis and interpretation. The diagnostics console 103 and the SPU 101 can constrain some of the signals on one or more test wrappers 102 in order to affect the behavior of the IC 100 and perform logic analysis under these conditions. For example, this approach may be useful to determine how the overall behavior of the IC 100 is affected when some of the functionality of any one of the blocks 106 is disabled.

In a different mode of operation automatic test equipment (ATE) may access the IC 100 through its TAP interface 217 in order to initialize the SPU 101 so that internal scan strings 403 and test wrappers 102 are loaded with predetermined test values. The response of the blocks 106 is observed using the scan strings 403 and test wrappers 102. Furthermore, the ATE may be programmed to instruct the SPU 101 to execute BIST or other buffer memory 218 test functions and to check the results to determine pass or fail conditions.

In yet another mode of operation, it is possible to use an in-circuit test (ICT) or similar board-level test equipment to access the IC 100 through its TAP interface 217 in order to instruct the SPU 101 to turn-on its external memory test function. In this mode, patterns are generated by the SPU 101 and made to appear at specific I/O pins of the IC 100 which are coupled to external memory. For example, the IC 100 may generate the data and address values that are applied to the external memory. The data responses received are captured in order to determine if the external memory is functioning correctly.

While the description above provides a full and complete disclosure of the preferred embodiments of the present invention, various modifications, alternate constructions, and equivalents will be obvious to those with skill in the art. Thus, the scope of the present invention is limited solely by the metes and bounds of the appended claims.

What is claimed is:

1. An integrated circuit comprising:
   one or more logic blocks configured to generate one or more system operation signals at one or more system operation clock rates;
   a service processor unit configured to perform one or more debug operations on one or more of the logic blocks, the service processor unit comprising:
   a control unit configured to control the service processor unit;
   a memory;
   an analysis engine; and
   a bus interface; and a multiplicity of probe lines configured to capture and propagate one or more of the one or more system operation signals from the logic blocks to the service processor unit.

2. The integrated circuit of claim 1, wherein the analysis engine is configured to align signals received from the probe lines.

3. The integrated circuit of claim 1, wherein the analysis engine includes a variable first-in, first-out (FIFO) element.

4. The integrated circuit of claim 1, wherein the analysis engine is configured to store aligned signals in buffer memory.

5. The integrated circuit of claim 1, wherein the service processor unit further comprises a parallel I/O port, wherein data and instructions are sent through the parallel I/O port to the service processor unit from an external console, and wherein result data is provided through the parallel I/O port to the external console.

6. The integrated circuit of claim 1, wherein the service processor unit further comprises a serial I/O port, wherein data and instructions are sent through the serial I/O port to the service processor unit from an external console, and wherein result data is provided through the serial I/O port to the external console.

7. The integrated circuit of claim 1, wherein the service processor unit further comprises a JTAG port, wherein data and instructions are sent through the JTAG port to the service processor unit from an external console, and wherein result data is provided through the JTAG port to the external console.

8. The integrated circuit of claim 1, wherein the multiplicity of probe lines includes at least one analog probe line.

9. The integrated circuit of claim 1, wherein the multiplicity of probe lines includes at least one digital probe line.

10. The integrated circuit of claim 9, wherein the digital probe line comprises at least one storage element and is configured to move one or more of the system operation signals from one or more of the logic blocks to the service processor unit via the bus interface.

11. The integrated circuit of claim 10, wherein the at least one storage element is configured to use a system clock to move the one or more of the system operation signals.

12. The integrated circuit of claim 1, wherein the control unit is configured to execute instructions for providing test signals to one or more of the logic blocks and for retrieving one or more test signal results from one or more of the logic blocks.

13. The integrated circuit of claim 1, wherein the bus interface is a test bus interface.

14. The integrated circuit of claim 1, further comprising: a test access port controller.

15. An integrated circuit comprising:
a multiplicity of logic blocks configured to generate one or more system operation signals;
a logic analyzer coupled to at least one external interface; and
a multiplicity of probe lines configured to propagate signals to the logic analyzer, wherein at least one of the probe lines is configured to propagate at least one of the system operation signals, and wherein the logic analyzer is configured to:
store a selected set of the system operation signals for retrieval through the at least one external interface; and
align the selected set of system operation signals.

16. The integrated circuit of claim 15, wherein the logic analyzer includes a variable first-in, first-out (FIFO) element.

17. The integrated circuit of claim 15, wherein at least one of the probe lines is configured to propagate at least one signal representing at least one analog event.

18. The integrated circuit of claim 17, wherein the at least one analog event comprises a ground bounce event.

19. The integrated circuit of claim 15, further comprising an analog-event detection circuit, wherein at least one of the probe lines is configured to propagate one or more signals from the analog-event detection circuit.

20. The integrated circuit of claim 19, wherein the analog-event detection circuit is configured to detect a voltage level.

21. The integrated circuit of claim 15, wherein the multiplicity of probe lines includes at least one digital probe line.

22. An integrated circuit comprising:
one or more logic blocks configured to generate one or more system operation signals at one or more system operation clock rates;
a service processor unit configured to perform one or more debug operations on one or more of the logic blocks, the service processor unit comprising:
a control unit;
a memory;
an analysis engine; and
a bus interface; and
a multiplicity of probe lines configured to capture one or more of the one or more system operation signals from the logic blocks to the service processor unit, wherein the analysis engine is configured to align signals received from the probe lines.

* * * * *